(12) United States Patent
Jeon et al.

(10) Patent No.: US 11,747,673 B2
(45) Date of Patent: Sep. 5, 2023

(54) WHITE LIGHT EMITTING DEVICE AND DISPLAY DEVICE USING THE SAME

(71) Applicant: SAMSUNG ELECTRONICS CO., LTD., Suwon-si (KR)

(72) Inventors: Jong Pil Jeon, Goyang-si (KR); Jong-hoi Kim, Suwon-si (KR); Kye Hoon Lee, Yongin-si (KR); Dae-hee Lee, Hwaseong-si (KR); Byoung-jin Cho, Anyang-si (KR); Suk-ju Choi, Jeonju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/150,654

(22) Filed: Jan. 5, 2023

(65) Prior Publication Data

US 2023/0146908 A1 May 11, 2023

Related U.S. Application Data

(63) Continuation of application No. 17/365,701, filed on Jul. 1, 2021, now Pat. No. 11,579,485, which is a
(Continued)

(30) Foreign Application Priority Data

Dec. 3, 2014 (KR) .................. 10-2014-0171973
Jun. 30, 2015 (KR) .................. 10-2015-0092852

(51) Int. Cl.
*G02F 1/13357* (2006.01)
*F21K 9/64* (2016.01)
(Continued)

(52) U.S. Cl.
CPC .......... *G02F 1/133603* (2013.01); *F21K 9/64* (2016.08); *G02F 1/133606* (2013.01);
(Continued)

(58) Field of Classification Search
CPC ... H05B 33/00; H01L 51/5012; H01L 27/153; H01L 31/143; G02F 1/133617;
(Continued)

(56) References Cited

U.S. PATENT DOCUMENTS

| 6,340,824 B1 | 1/2002 | Komoto et al. |
| 2007/0215890 A1 | 9/2007 | Harbers et al. |

(Continued)

FOREIGN PATENT DOCUMENTS

| CN | 102128391 A | 7/2011 |
| CN | 102867900 A | 1/2013 |

(Continued)

OTHER PUBLICATIONS

Communication dated Apr. 19, 2016, issued by the International Searching Authority in counterpart International Application No. PCT/KR2015/013039 (PCT/ISA/210).
(Continued)

*Primary Examiner* — Mariam Qureshi
(74) *Attorney, Agent, or Firm* — Sughrue Mion, PLLC

(57) ABSTRACT

A white light emitting device, including a circuit board; a plurality of light sources mounted on the circuit board, each light source of the plurality of light sources configured to emit monochromatic light; a light converter spaced apart from the circuit board, the light converter configured to convert the monochromatic light emitted from the light sources to white light; and a compensator provided between the circuit board and the light converter, the compensator configured to convert the emitted monochromatic light to white light.

18 Claims, 29 Drawing Sheets

Related U.S. Application Data continuation of application No. 16/723,520, filed on Dec. 20, 2019, now Pat. No. 11,112,648, which is a continuation of application No. 14/958,453, filed on Dec. 3, 2015, now Pat. No. 10,545,375.

(51) Int. Cl.
*F21Y 115/10* (2016.01)
*G02F 1/1335* (2006.01)

(52) U.S. Cl.
CPC ..... *G02F 1/133609* (2013.01); *F21Y 2115/10* (2016.08); *G02F 1/133614* (2021.01); *H01L 2224/1403* (2013.01); *H01L 2224/16225* (2013.01)

(58) Field of Classification Search
CPC ..... G02F 2201/44; G02F 2001/133614; G02F 1/133603; F21K 9/64; F21K 9/66; H01H 2219/036; F21V 5/004
See application file for complete search history.

(56) References Cited

U.S. PATENT DOCUMENTS

| | | |
|---|---|---|
| 2010/0045154 A1 | 2/2010 | Kim et al. |
| 2010/0085727 A1 | 4/2010 | Igarashi et al. |
| 2010/0123855 A1 | 5/2010 | Shin |
| 2010/0296312 A1 | 11/2010 | Van Gorkom et al. |
| 2011/0164203 A1* | 7/2011 | Kimura ............... G02B 6/003 349/62 |
| 2012/0187427 A1 | 7/2012 | Chandra |
| 2012/0262631 A1 | 10/2012 | Kuromizu |
| 2012/0274240 A1 | 11/2012 | Lee et al. |
| 2013/0070448 A1 | 3/2013 | Galvez et al. |
| 2013/0170174 A1 | 7/2013 | Chou et al. |
| 2013/0278134 A1 | 10/2013 | Ko et al. |
| 2014/0227806 A1 | 8/2014 | Sohn et al. |
| 2014/0368751 A1 | 12/2014 | Han et al. |
| 2015/0055347 A1 | 2/2015 | Kim et al. |
| 2015/0069439 A1 | 3/2015 | Deeben et al. |
| 2015/0197689 A1 | 7/2015 | Tani et al. |
| 2016/0178824 A1* | 6/2016 | Giacomini ........... G02B 6/0043 362/610 |
| 2017/0084799 A1 | 3/2017 | Ouderkirk et al. |
| 2017/0309795 A1 | 10/2017 | Kim et al. |
| 2018/0080614 A9 | 3/2018 | Aanegola et al. |

FOREIGN PATENT DOCUMENTS

| | | |
|---|---|---|
| CN | 103791322 A | 5/2014 |
| EP | 2 363 884 A1 | 9/2011 |
| JP | 4727314 B2 | 7/2011 |
| JP | 5297472 B2 | 9/2013 |
| KR | 10-2009-0119723 A | 11/2009 |
| KR | 10-2011-0059666 A | 6/2011 |
| KR | 10-2011-0084788 A | 7/2011 |
| KR | 10-1204736 B1 | 11/2012 |
| KR | 10-2013-0070043 A | 6/2013 |
| KR | 10-1356367 B1 | 1/2014 |
| KR | 10-1429911 B1 | 8/2014 |
| KR | 10-1623185 B1 | 5/2016 |
| KR | 10-1713148 B1 | 3/2017 |
| KR | 10-1751053 B1 | 6/2017 |
| WO | 2009/017794 A1 | 2/2009 |

OTHER PUBLICATIONS

Communication dated Apr. 2, 2019, issued by the European Patent Office in counterpart European Application No. 19153846.1.
Communication dated Apr. 25, 2018, issued by the European Patent Office in European Patent Application No. 15195259.5.
Communication dated Aug. 22, 2019, issued by the Korean Intellectual Property Office in corresponding Korean Application No. 10-2015-0092852.
Communication dated Dec. 21, 2022, issued by the China National Intellectual Property Administration in counterpart Chinese Application No. 201510829046.9.
Communication dated Feb. 23, 2017 issued by European Patent Office in counterpart European Application No. 15 195 259.5.
Communication dated Feb. 28, 2019 issued by the State Intellectual Property Office of P.R. China in counterpart Chinese Application No. 201510829046.9.
Communication dated Jan. 15, 2021, issued by the State Intellectual Property Office of P.R. China in counterpart Chinese Application No. 201510829046.9.
Communication dated Jul. 28, 2020, from the State Intellectual Property Office of People's Republic of China in counterpart Application No. 201510829046.9.
Communication dated Mar. 16, 2020 issued by the European Intellectual Property Office in counterpart European Application No. 20153718.0.
Communication dated May 11, 2016 issued by the European Patent Office in counterpart Application No. 15195259.5.
Communication dated Oct. 7, 2019, from the European Patent Office in counterpart European Application No. 19153846.1.
Communication dated Oct. 8, 2018, issued by the European Patent Office in counterpart European Patent Application No. 15195259.5.
Communication dated Sep. 15, 2022 issued by the State Intellectual Property Office of P.R. China in counterpart Chinese Application No. 201510829046.9.
Communication dated Nov. 27, 2019 by the State Intellectual Property Office of P.R. China in counterpart Chinese Patent Application No. 201510829046.9.
Communication dated Sep. 24, 2021 by the Indian Patent Office in Indian Patent Application No. 4527/MUM/2015.
Communication dated May 15, 2019, issued by the Indian Patent Office in counterpart Indian Application No. 4527/MUM/2015.

* cited by examiner

WHITE LIGHT EMITTING DEVICE AND DISPLAY DEVICE USING THE SAME

CROSS-REFERENCE TO RELATED APPLICATION

This is a continuation of U.S. application Ser. No. 17/365,701 filed Jul. 1, 2021, which is a continuation of U.S. application Ser. No. 16/723,520, filed on Dec. 20, 2019, issued as U.S. Pat. No. 11,112,648 on Sep. 7, 2021, which is a continuation of U.S. application Ser. No. 14/958,453, filed on Dec. 3, 2015, issued as U.S. Pat. No. 10,545,375 on Jan. 28, 2020, which claims priority from Korean Patent Application No. 10-2014-0171973, filed on Dec. 3, 2014, and Korean Patent Application No. 10-2015-0092852, filed on Jun. 30, 2015, in the Korean Intellectual Property Office, the disclosures of which are incorporated herein by reference in their entireties.

BACKGROUND

1. Field

Exemplary embodiments relate to a white light emitting device which emits white light using a light source which emits a monochromatic light and a display panel including the same.

2. Description of the Related Art

Light emitting devices such as light emitting diodes (LEDs) are optical semiconductor devices which emit light by recombination of minority carriers (electrons or holes). Light generated by the recombination of the minority carriers is a monochromatic light having a certain range of a wavelength.

Methods of generating white light include using a plurality of light emitting devices emitting a variety of the monochromatic light having complementary colors, and a using one light emitting device and a phosphor having a complementary color of the monochromatic light emitted by the light emitting device.

When white light is synthesized using a plurality of light emitting devices, a color reproduction range may be widened. However, because electrical characteristics of each of the light emitting devices may be different from each other, driving circuits become complex, and because the characteristic change of the light emitting devices according to usages are different from each other, color uniformity may not be ensured.

In addition, when white light is synthesized using one light emitting device and a phosphor, driving circuits may be simplified. However, color uniformity cannot be ensured due to reflection, refraction, or the like of the monochromatic light.

SUMMARY

Therefore, it is an aspect of the exemplary embodiments to provide a white light emitting device having improved color uniformity and a display panel using the same.

Additional aspects of the exemplary embodiments will be set forth in part in the description which follows and, in part, will be obvious from the description, or may be learned by practice of the exemplary embodiments.

According to an aspect of an exemplary embodiment, a white light emitting device includes a circuit board; a plurality of light sources mounted on the circuit board, each light source of the plurality of light sources configured to emit monochromatic light; a light converter spaced apart from the circuit board, the light converter configured to convert the monochromatic light emitted from the light sources to white light; and a compensator provided between the circuit board and the light converter, the compensator configured to convert the emitted monochromatic light to white light.

The compensator may include a plurality of phosphor members formed of a phosphor having a color that is complementary to a color of the emitted monochromatic light.

The plurality of phosphor members may be disposed between the plurality of light sources.

At least one phosphor member of the plurality of phosphor members may be disposed inside at least one light source of the plurality of light sources.

The at least one light source may include a light emitting device package configured to generate a monochromatic light; and a lens configured to accommodate the light emitting device package and emit the monochromatic light, and the at least one phosphor member may be disposed between the light emitting device package and the lens and convert a monochromatic light reflected inside of the at least one light source to white light.

An arrangement pattern of the plurality of phosphor members may be determined according to a pattern of a color mura of the white light emitted from the light converter.

The plurality of phosphor members may include a first group of phosphor members disposed on an edge of the circuit board, and a second group of phosphor members disposed at a center of the circuit board, and the first group may be more densely arranged than the second group.

A size of the phosphor members may be determined according to a level of a color mura of white light converted from the light converter.

The plurality of phosphor members may include a first phosphor member having first size and located on an edge of the circuit board and a second phosphor member having a second size and located on a center of the circuit board, and the first size may be greater than the second size.

The white light emitting device may include a coated layer stacked on the compensator.

The white light emitting device may include a reflector including a plurality of openings corresponding to the plurality of light sources, stacked on the circuit board, and reflecting the monochromatic light toward the light converter.

According to another aspect of an exemplary embodiment, a white light emitting device includes a circuit board; a plurality of light sources mounted on the circuit board, each light source of the plurality of light sources configured to emit blue light; a light converter spaced apart from the circuit board, the light converter configured to convert the blue light emitted from the light sources to white light; a reflective sheet stacked on the circuit board, the reflective sheet configured to reflect the blue light toward the light converter; and a compensator provided between the circuit board and the reflective sheet, the compensator configured to convert the blue light to white light.

The compensator may include a plurality of phosphor members having a yellow phosphor.

The plurality of phosphor members may be arranged between the plurality of light sources.

An arrangement pattern of the plurality of phosphor members may be determined according to a pattern of a color mura of the white light converted from the light converter.

The plurality of phosphor members may include a first group of phosphor members disposed on an edge of the circuit board, and a second group of phosphor members disposed at a center of the circuit board, and the first group may be more densely arranged than the second group.

The plurality of phosphor members may be directly printed and formed on the reflective sheet.

At least one light source of the plurality of light sources may include a light emitting device package configured to generate blue light; and a lens configured to emit the blue light generated from the light emitting device package, and the plurality of phosphor members are disposed between the lens and the light emitting device package.

The compensator may be formed of at least one from among a sheet or film having the plurality of phosphor members, and the compensator may be bonded to the reflective sheet.

The compensator may be formed by depositing the plurality of phosphor members on the reflective sheet.

The compensator may be formed by bonding the plurality of phosphor members to the reflective sheet.

According to a further aspect of an exemplary embodiment, a display device includes a liquid crystal panel; a light guide plate provided in a rear of the liquid crystal panel; and a white light emitting device provided in a rear of the light guide plate the white light emitting device configured to emit white light onto the light guide plate, wherein the white light emitting device includes: a circuit board; a plurality of light sources mounted on the circuit board, each light source of the plurality of light sources configured to emit a monochromatic light; a light converter spaced apart from the circuit board, the light converter configured to convert the monochromatic light incident from the light sources to white light; and a compensator provided between the circuit board and the light converter, the compensator configured to convert the incident monochromatic light to white light.

According to a still further aspect of an exemplary embodiment, a white light emitting device includes a circuit board; a light source mounted on the circuit board, the light source configured to emit a monochromatic light; a light converter configured to convert the emitted monochromatic light to white light; and a compensator provided between the circuit board and the light converter, wherein a portion of the emitted monochromatic light is reflected by at least one from among the light converter or the circuit board, and the compensator may be configured to convert the reflected monochromatic light to white light.

The compensator may include a plurality of phosphor members formed of a phosphor having a color that is complementary to a color of the reflected monochromatic light.

The plurality of phosphor members may be disposed on the circuit board adjacent to the light source.

BRIEF DESCRIPTION OF THE DRAWINGS

These and/or other aspects of the exemplary embodiments will become apparent and more readily appreciated from the following description, taken in conjunction with the accompanying drawings of which.

DETAILED DESCRIPTION

Figure 1:
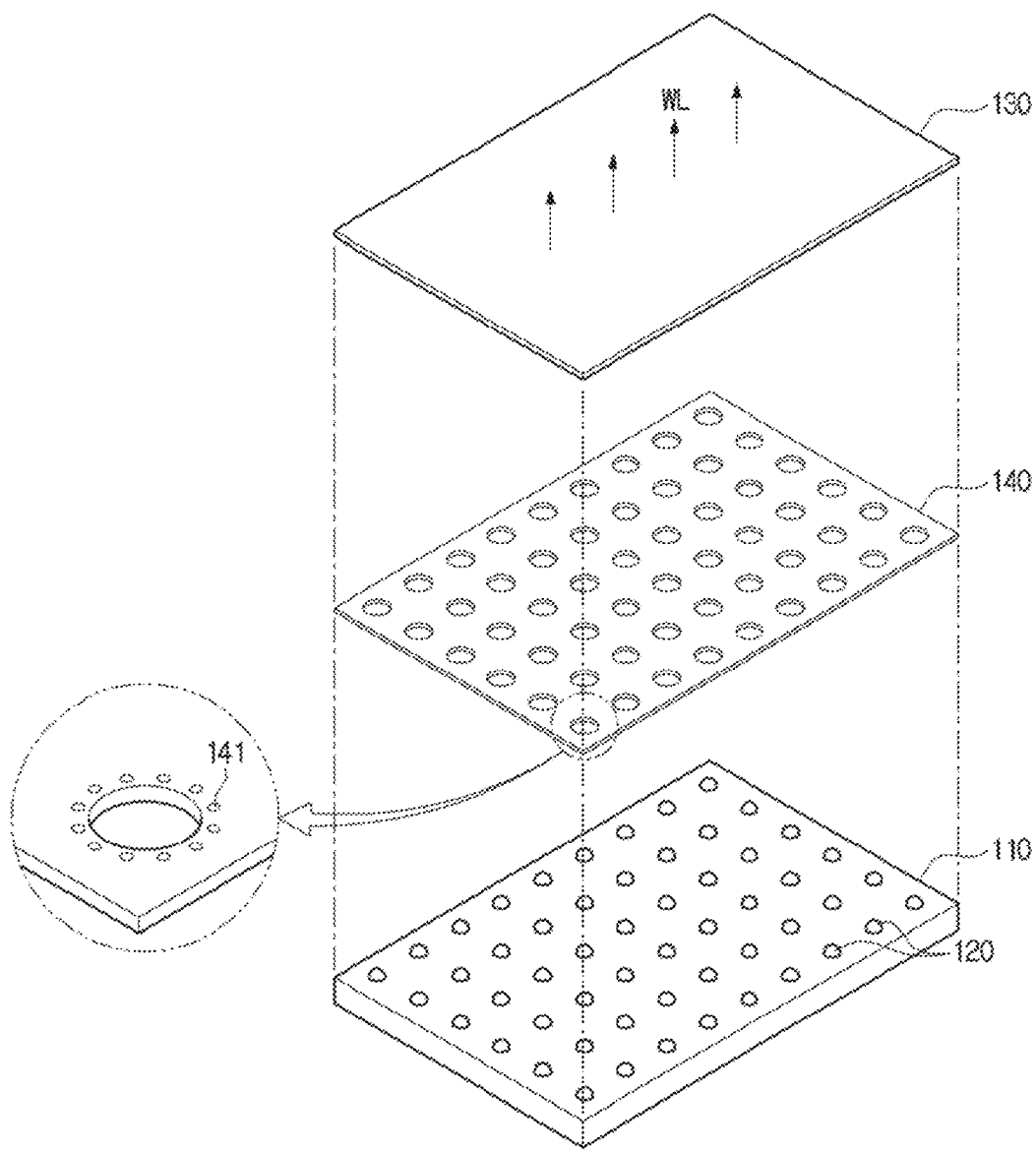
FIG. 1 is a schematic exploded perspective view of a white light emitting device in accordance with an exemplary embodiment.

Advantages and features of the exemplary embodiments and methods of achieving the same will be clearly understood with reference to the accompanying drawings and the following detailed description. However the description is not limited to the exemplary embodiments to be disclosed, but may be implemented in various different forms. The exemplary embodiments are not intended to modify the scope as defined by the appended claims. Hereinafter, the exemplary embodiments will be described in detail with reference to accompanying views.

Reference will now be made in detail to the exemplary embodiments, examples of which are illustrated in the accompanying drawings, wherein like reference numerals generally refer to like elements throughout.

FIG. 1 is a schematic exploded perspective view of a white light emitting device in accordance with one exemplary embodiment.

Referring to FIG. 1, a white light emitting device 100 in accordance with one exemplary embodiment may include a circuit board 110, a plurality of light sources 120 which are mounted on the circuit board 110 and emit a variety of monochromatic light (ML), a light converter 130 which converts the monochromatic light to white light, and a compensator 140 which is provided between the plurality of light sources 120 and reduces a color mura.

The monochromatic light having a wavelength in a certain range visually appears as one color. For example, the monochromatic light may have one color from among blue light, red light, and green light.

The plurality of light sources 120 are mounted on the circuit board 110. An electrode pattern or a circuit pattern may be formed on the circuit board 110, the light sources 120 and the circuit board 110 may be electrically connected by a wire bonding or flip chip bonding method, etc. The circuit board 110 may be implemented by a printed circuit board 110, but it may also be implemented by a flexible circuit board 110 (flexible copper clad laminate) according to necessity.

Figure 2:
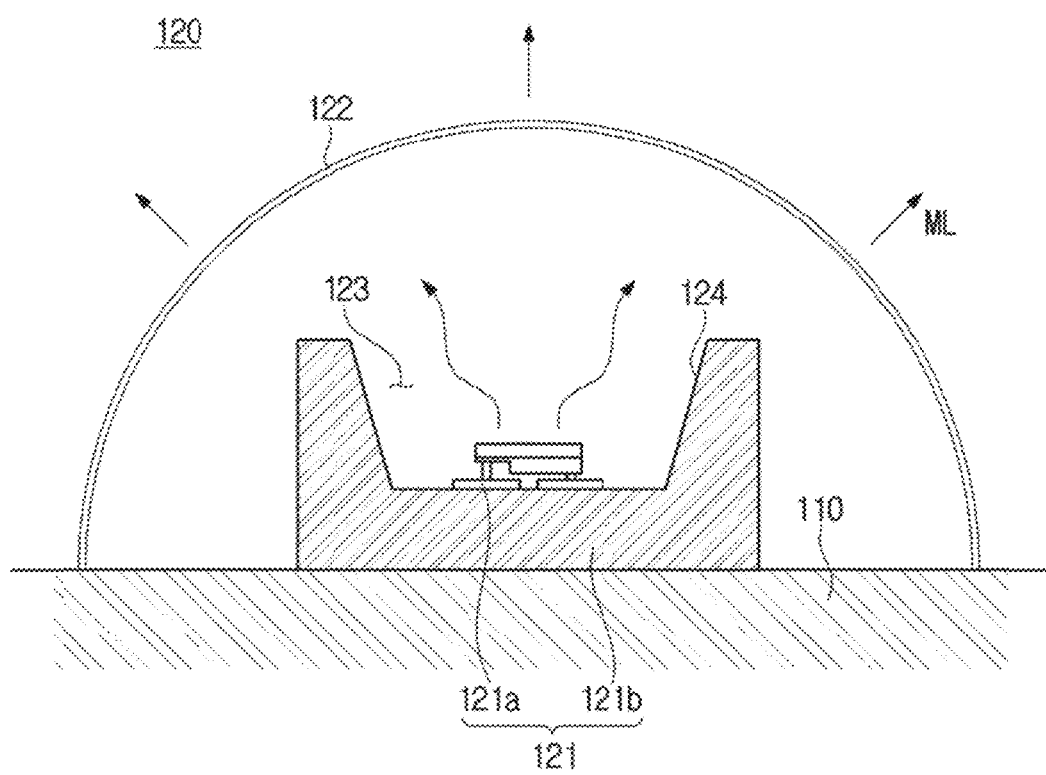
FIG. 2 is a cross-sectional view of a light source of a white light emitting device in accordance with an exemplary embodiment.
Figure 3:
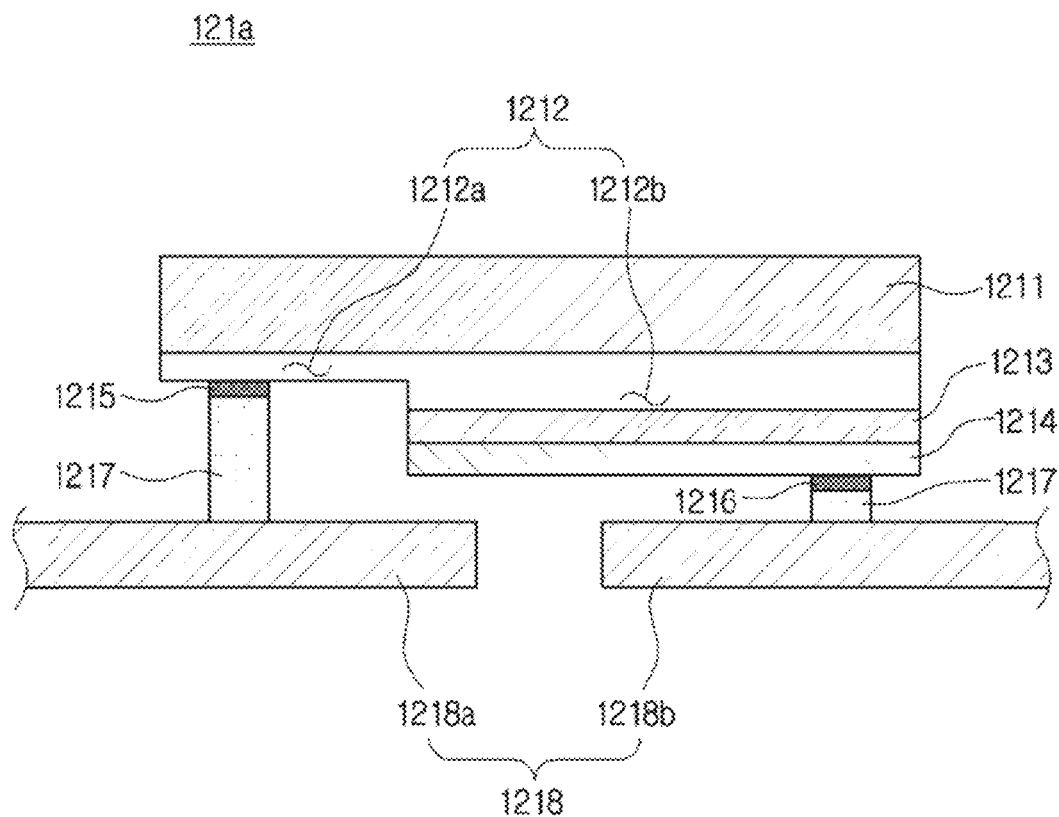
FIG. 3 is a view for describing an exemplary embodiment of a light emitting device which emits a monochromatic light.

FIG. 2 is a cross-sectional view of a light source 120 of a white light emitting device 100 in accordance with one exemplary embodiment. FIG. 3 is a view for describing one exemplary embodiment of a light emitting device 121a which emits a monochromatic light.

As shown in FIG. 2, a light source 120 may be provided as a package type and mounted on a circuit board 110. The light source 120 generates and emits a monochromatic light. Specifically, the light source 120 includes a light emitting device package 121 which generates the monochromatic light and a lens 122 which emits the monochromatic light.

The light emitting device package 121 includes the light emitting device 121a which emits the monochromatic light and a body 121b in which the light emitting device 121a is accommodated. The light emitting device 121a may be a light emitting diode (LED). Hereinafter, an exemplary embodiment of the light emitting device 121a will be described with reference to FIG. 3.

As shown in FIG. 3, the light emitting device 121a may have a structure in which a substrate 1211, an N-type semiconductor layer 1212, an active layer 1213, and a P-type semiconductor layer 1214 are sequentially stacked.

The substrate 1211 may be formed of a transparent material such as sapphire, and also formed of zinc oxide (ZnO), gallium nitride (GaN), silicon carbide (SiC), and aluminum nitride (AlN) in addition to sapphire.

In some exemplary embodiments, a buffer layer may be formed between the substrate 1211 and the N-type semiconductor layer 1212. The buffer layer is for improving lattice matching before growing the N-type semiconductor layer 1212 on the substrate 1211, and may be omitted according to process conditions and device characteristics.

The N-type semiconductor layer 1212 may be formed of a semiconductor material which has a compositional formula of InXAlYGa (1−X−Y) N (here, 0≤X, 0≤Y, and X+Y≤1). In more detail, the N-type semiconductor layer 1212 may be formed with a GaN layer or a GaN/AlGaN layer doped with N-type conductive impurities, and for example, silicon (Si), germanium (Ge), tin (Sn), or the like may be used as the N-type conductive impurities.

The N-type semiconductor layer 1212 may be classified as a first layer 1212a and a second layer 1212b. The first layer 1212a may define a light emitting face, and the first layer 1212a is formed to have an area larger than the second layer 1212b, and an optical characteristic of the light emitting device 121a may be improved. On the second layer 1212b, an active layer 1213 and the P-type semiconductor layer 1214 may be sequentially stacked to form a light emitting structure.

The active layer 1213 may be formed with an InGaN/GaN layer having a multi-quantum well structure.

The P-type semiconductor layer 1214 may be formed of a semiconductor material which has a compositional formula of InXAlYGa (1−X−Y) N (here, 0≤X, 0≤Y, and X+Y≤1). In more detail, the P-type semiconductor layer 1214 may be formed with a GaN layer or a GaN/AlGaN layer doped with P-type conductive impurities, and for example, magnesium (Mg), zinc (Zn), beryllium (Be), or the like may be used as the P-type conductive impurities.

An N-type electrode 1215 is formed on the N-type semiconductor layer 1212, and a P-type electrode 1216 is formed on the P-type semiconductor layer 1214.

An adhesive layer 1217 may have a structure in which metal layers respectively formed of a single element are stacked as a multilayer, and include a reflective material to prevent that the reflectivity of a lead frame affects the characteristics of the light emitting devices 121a. For example, the adhesive layer 1217 may be formed of a metal containing tin (Sn) or silver (Ag).

The lead frame is formed on the bottom of the body 121b to supply a power source from the light emitting device 121a. In addition, the lead frame may include a reflective material or be coated with a reflective material which may reflect light generated by the light emitting device 121a.

The lead frame includes a first lead frame and a second lead frame. The first lead frame and the second lead frame have an interval of a certain distance, and the first lead frame is electrically connected to the N-type electrode 1215 and the second lead frame is electrically connected to the P-type electrode 1216.

When power is applied to the above-described light emitting device package 121, electrons and holes flow from the N-type semiconductor layer 1212 and the P-type semiconductor layer 1214 into the active layer 1213, and a monochromatic light is generated by recombination of the electrons and holes flowing into the active layer 1213.

A color of the monochromatic light generated by the light emitting device package 121 may be determined by a component of the semiconductor described above. For example, when a GaN based semiconductor is used, the light emitting device 121a generates blue light.

Meanwhile, FIG. 3 is a simple view for describing one exemplary embodiment of the light emitting device package 121, but the structure of the light emitting device package 121 is not limited thereto. For example, in some exemplary embodiments, the light emitting device 121a may have a structure in which the P-type semiconductor layer 1214 is disposed on an upper part thereof and the N-type semiconductor layer 1212 is disposed on a lower part thereof.

Referring again to FIG. 2, the body 121b accommodates the light emitting device 121a. The body 121b may be formed of at least one from among a resin based material such as polyphthalamide (PPA), silicon (Si), aluminum (Al), aluminum nitride (AlN), a liquid crystal polymer (PSG, photo sensitive glass), a polyamide9T (PA9T), a syndiotactic polystyrene (SPS), a metal material, sapphire (Al2O3), beryllium oxide (BeO), and a printed circuit board (PCB) 110, but it is not limited thereto.

The body 121b may be formed by an injection molding process, an etching process, or the like but is not limited thereto. For example, the body 121b may be integrally formed with the circuit board 110 by an injection molding process.

In addition, the body 121b includes a cavity 123 which accommodates the light emitting device 121a described above. A width and a height of the cavity 123 may be larger than those of the light emitting device 121a, but those are not limited thereto.

The cavity 123 may be formed in a shape in which the width of the cavity 123 decreases in a downward direction. That is, a sidewall 124 of the cavity 123 may be formed to be sloped. Here, a reflection angle of the monochromatic light emitted by the light emitting device 121a varies according to an angle of the sidewall 124. Therefore, the degree of slope of the sidewall 124 may be adjusted to adjust a beam angle of the monochromatic light.

Specifically, when the degree of slope of the sidewall 124 is decreased, a beam angle of the light is decreased and convergence of light emitted into the outside from the light emitting device 121a is increased. On the contrary, when the degree of slope of the sidewall 124 is increased, the beam angle of light is increased and convergence of light emitted into the outside from the light emitting device 121a is decreased.

In addition, a reflective material which reflects light generated by the light emitting device 121a may be coated on the sidewall 124 and a use rate of light generated by the light emitting device 121a may be increased.

In some exemplary embodiments, the cavity 123 is molded with a material which has excellent or otherwise desirable water tightness, corrosion resistance, and electric insulation, and may encapsulate the light emitting device 121a mounted inside the cavity 123. For example, the cavity 123 may be molded with an epoxy resin or silicon resin, or the like, and the molding process may be performed by an ultraviolet ray method or a heat curing method.

The lens 122 is provided outside of the light emitting device package 121, and guides the monochromatic light generated by the emitting device package 121. The lens 122 emits the monochromatic light generated by the light emitting device package 121 in a direction of a light converter 130.

The lens 122 may have a wide beam angle of light. The monochromatic light emitted by the light emitting device package 121 may be widened through the lens 122. Therefore, when the beam angle of light is widened, because the light source 120 and the light converter 130 may be provided adjacently, a thickness of the white light emitting device 100 may become small.

In addition, when the beam angle of light is widened, because the monochromatic light emitted by the plurality of light emitting device packages 121 is uniformly incident to the light converter 130, the brightness uniformity of the white light emitting device 100 may be increased.

As shown in FIGS. 1 to 3, the lens 122 may be formed in a hemispherical shape, but the shape of the lens 122 is not limited thereto.

For example, the shape of the lens 122 may be one selected from among a square pillar such as a regular hexahedron, a cylindrical type, an elliptical type, a bat-wing type having a concave center. However, the hemispherical shape can have excellent or desirable incident efficiency into a light converting layer.

Meanwhile, although the light sources 120 arranged in a rectangular shape is shown in FIG. 1, the arrangement of the light sources 120 is not limited thereto. That is, the plurality of light sources 120 may be arranged in various shapes to reduce the deviation of brightness and colors, and to improve in the output uniformity of white light. For example, the light sources 120 may be arranged in a hexagonal shape.

Figure 4:
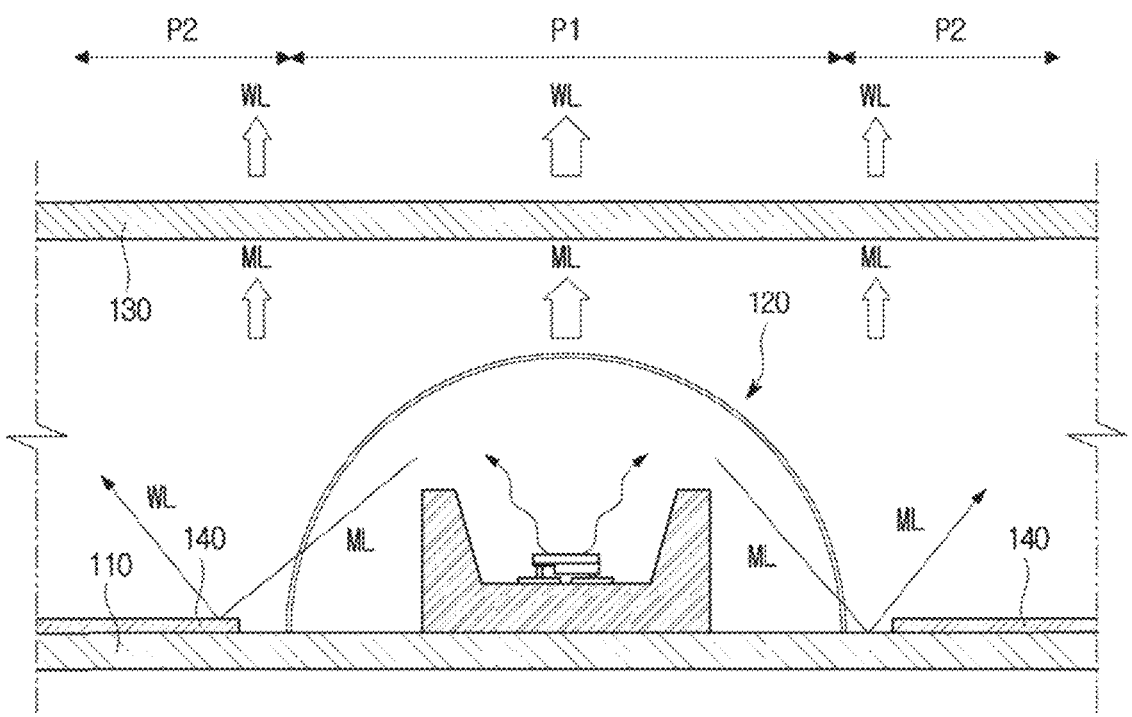
FIG. 4 is a cross-sectional view of a white light emitting device in accordance with an exemplary embodiment.

FIG. 4 is a cross-sectional view of a white light emitting device 100 in accordance with one exemplary embodiment.

Referring to FIGS. 1 and 4, the light converter 130 converts an incident monochromatic light to white light and guides the white light to the front thereof. To this end, the light converter 130 may include a phosphor which converts a wavelength of the incident monochromatic light to a monochromatic light of different color to be transferred.

For example, although the phosphor may include at least one of a variety of light emitting material among a yttrium aluminum garnet (YAG) based material, a terbium aluminum garnet (TAG) based material, a silicate based material, a sulfide based material, a nitride based material, a borate based material, and a phosphate based material, the light emitting material configuring the phosphor is not limited thereto.

The light emitting material configuring the phosphor may be determined according to a monochromatic light incident from the light source 120. That is, the light converter 130 may include a phosphor emitting light having a complementary color of the monochromatic light emitted from the light source 120.

For example, when the light source 120 emits blue light, the light converter 130 may include a yellow light emitting phosphor having a complementary color of a blue color. The yellow light emitting phosphor includes a YAG based light emitting material, absorbs incident blue light, and emits yellow light. Then, blue light not involved in light emitting of the yellow color phosphor and yellow light emitted by the yellow color phosphor are mixed to become white light.

In some exemplary embodiments, when the light source 120 emits red light, the light converter 130 may include a cyan light emitting phosphor having a complementary color of the red color, and when the light source 120 emits green light, the light converter 130 may include a magenta light emitting phosphor having a complementary color of the green color.

Meanwhile, the light converter 130 may convert a monochromatic light to white light using a plurality of phosphors. As described above, the light converter 130 converts the monochromatic light to white light based on a principle of mixing light. For example, white light may also be generated by mixing blue light, red light, and green light.

Therefore, the light converter 130 may include a plurality of phosphors which emit different colors from each other. That is, the light converter 130 may generate complementary color light having a complementary color of the monochromatic light emitted by the light source 120 using the plurality of phosphors.

For example, when the monochromatic light emitted by the light source 120 is blue, the light converter 130 may include a green light emitting phosphor and red light emitting phosphor. The red light emitting phosphor absorbs incident blue light and emits red light, and the green light emitting phosphor absorbs blue light and emits green light.

Accordingly, blue light not involved in light emitting of phosphor, green light emitted by the green light emitting phosphor, and red light emitted by red light emitting phosphor may be mixed to become white light. Here, the green light emitting phosphor and red light emitting phosphor may be formed on different layers.

A green light emitting phosphor may include at least one selected from a group of a nitride based phosphor, a sulfide based phosphor, a silicate based phosphor, and a quantum dot based phosphor.

A red light emitting phosphor may include at least one selected from a group of a nitride based phosphor, a sulfide based phosphor, a fluorinated based phosphor, and a quantum dot based phosphor.

A compensator 140 improves the color uniformity of a white light emitting device 100. A color mura occurs in the white light emitting device 100 by refraction, reflection, and diffraction of the monochromatic light generated from the white light emitting device 100. Color mura can be, for example, an unevenness or non-uniformity in the white light produced by the white light emitting device 100. The compensator 140 is located between a circuit board 110 and a light converter 130, and may convert a monochromatic light, which is refracted, reflected, and diffracted, to white light to compensate the color mura.

Specifically, as shown in FIG. 4, the monochromatic light generated by a light emitting device package 121 is emitted onto a light converter 130 through a lens 122. However, part of the monochromatic light generated by the light emitting device package 121 may be scattered, reflected, diffracted, and recycled in the white light emitting device 100, and is incident to the light converter 130. For example, a monochromatic light refracted by the lens 122 is reflected by a substrate and is incident to the light converter 130.

A color mura occurs in the white light emitting device 100 by a difference between incident paths of the monochromatic light. Specifically, a comparatively great amount of blue light is incident to a part P1 of the light converter 130 adjacent to the light source 120, and a bluish color of white light WL is emitted therefrom. However, a comparatively great amount of blue light having a different path is incident to a part P2 of the light converter 130 between the light source 120 and another light source 120, and a yellowish color of white light WL is emitted therefrom.

Therefore, the compensator 140 converts part of light incident to the light converter 130 through a different light path to white light to reduce the color mura. The compensator 140 may include at least one phosphor member 141 which converts an incident monochromatic light to white light.

The phosphor member 141 may include a phosphor which converts a wavelength of the incident monochromatic light to emit a different color of the monochromatic light. The phosphor included in the phosphor member 141 may include various kinds of phosphors described above, and convert an incident monochromatic light to different wavelength light to emit the light.

Here, a light emitting material configuring a phosphor may be determined according to an incident monochromatic light ML from the light source 120. That is, the phosphor member 141 may include a phosphor which emits a complementary color of a monochromatic light ML emitted by the light source 120.

Because the same monochromatic light ML is incident to the compensator 140 and the light converter 130, a phosphor of the phosphor member 141 and a phosphor of the light converter 130 may be the same, but it is not limited thereto.

For example, because the phosphor member 141 may include a yellow light emitting phosphor, incident blue light is converted to white light, and because the light converter 130 may include a red light emitting phosphor and green light emitting phosphor, incident blue light is converted to white light.

On the contrary, because the light converter 130 may include a yellow light emitting phosphor, incident blue light is converted to white light, and because the phosphor member 141 may include a red light emitting phosphor and green light emitting phosphor, incident blue light is converted to white light.

Thus, the compensator 140 may convert part of the monochromatic light ML, which is scattered or reflected and is incident to light converter 130, to white light to improve the color uniformity of the white light emitting device 100.

While the disposition of the compensator 140 has no limitation, as shown in FIG. 4, in some exemplary embodiments the compensator 140 may be provided adjacent the circuit board 110, and convert monochromatic light ML reflected by the circuit board 110 to white light.

Here, as shown in FIG. 1, the compensator 140 may be provided in a shape of a compensation sheet or compensation film including the phosphor member 141, and formed by bonding the compensation sheet or the compensation film to the circuit board 110. But, a method of forming the compensator 40 is not limited thereto.

Figure 23:
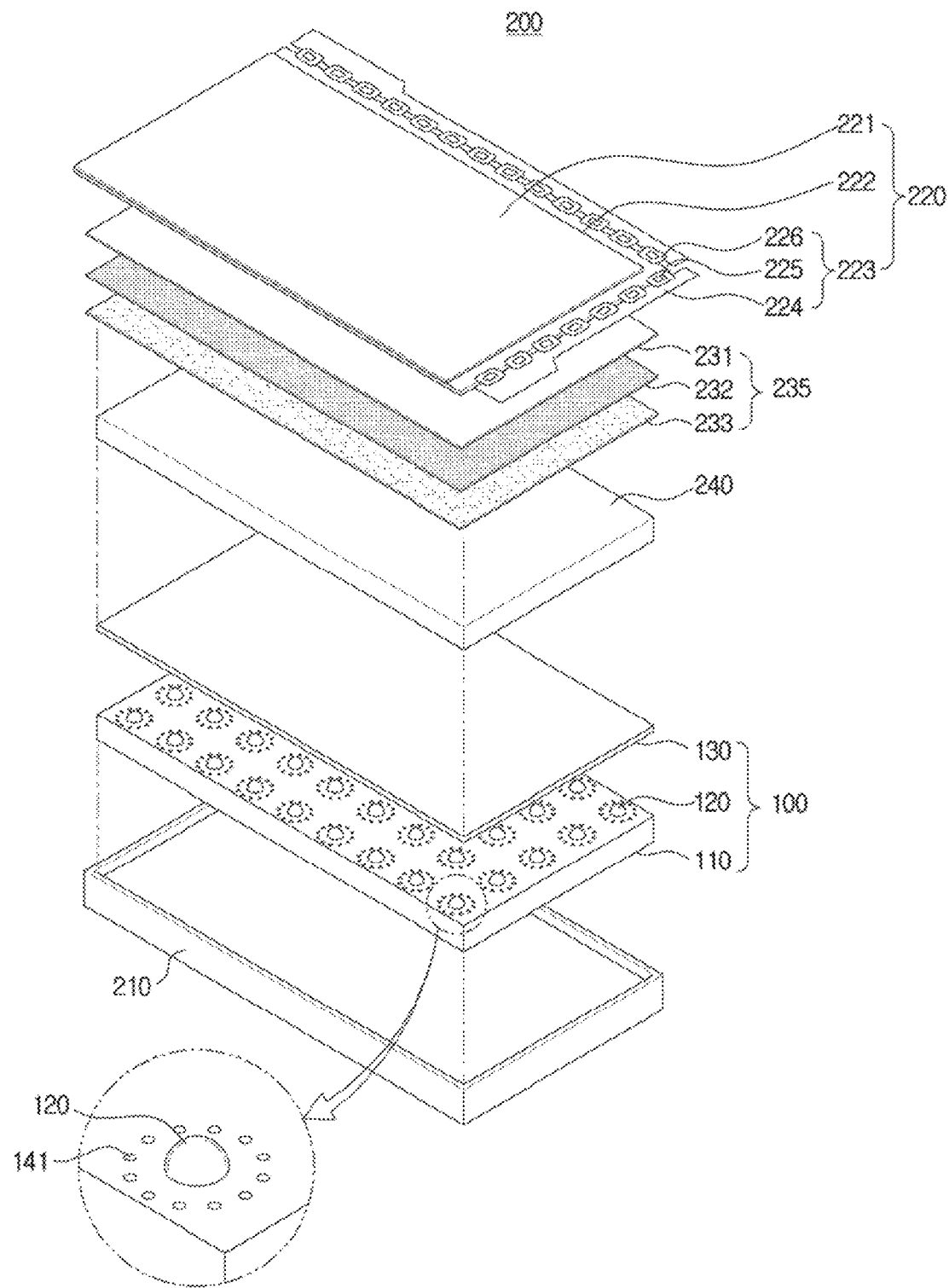
FIG. 23 is an exploded perspective view of a display device in accordance with another exemplary embodiment.

In another exemplary embodiment, as shown in FIG. 23, a compensator 140 may be directly formed on a circuit board 110. Specifically, the compensator 140 may be formed by a method of coating phosphor members 141 in a regular pattern onto the circuit board 110, or a method of depositing phosphor members 141 in a regular pattern on the circuit board 110.

In addition, the compensator 140 may be also formed by a method of directly printing phosphor members 141 on the circuit board 110. Specifically, the compensator 140 may be formed by a method of mixing a phosphor with an adhesive configured to fix the phosphor to the circuit board 110 in order to form a phosphor ink, and directly printing the phosphor ink formed on the circuit board 110 in order to form the phosphor members 141. Here, the phosphor members 141 may also be formed in a regular pattern. A pattern of the phosphor members 141 will be described in detail below.

Figure 5:
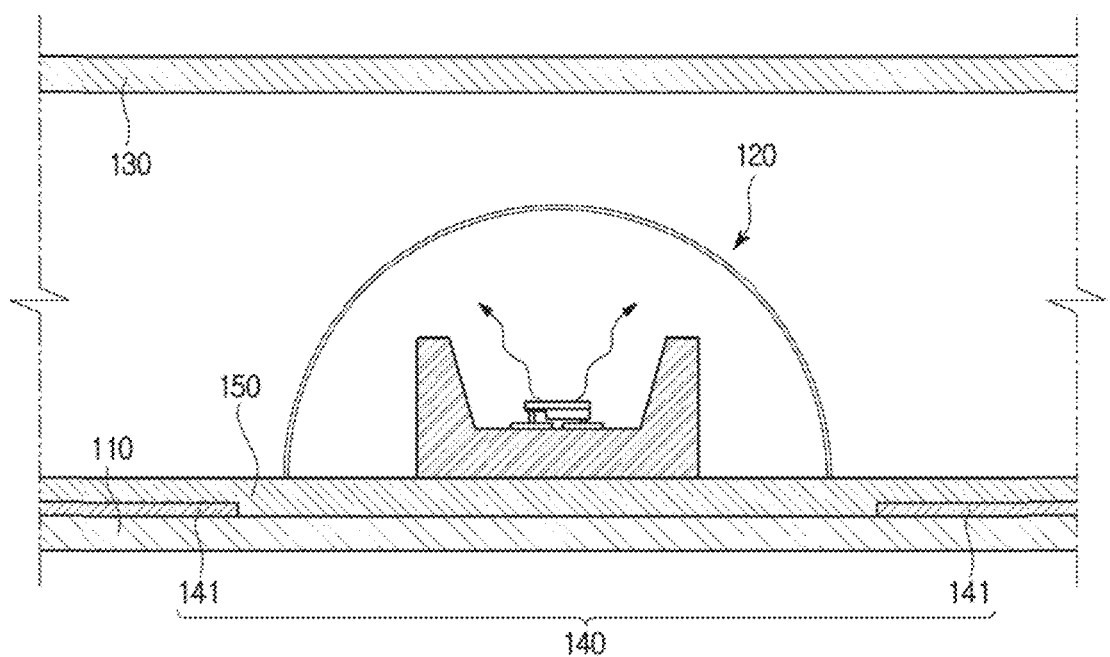
FIG. 5 is a cross-sectional view of a white light emitting device in accordance with another exemplary embodiment.

FIG. 5 is a cross-sectional view of a white light emitting device 100 in accordance with another exemplary embodiment.

Referring to FIG. 5, a white light emitting device 100 may further include a reflector 150. The reflector 150 may be stacked on a circuit board 110. The reflector 150 may reflect a monochromatic light emitted by a light source 120 toward a light converter 130 to increase the utilization rate of monochromatic light.

The reflector 150 may be formed with a reflective member which has a good elastic force and excellent light reflectivity and which is easy to form in a thin film. For example, the reflector 150 may be formed of reflective material such as a polyethylene terephthalate (PET) of a white color, a polycarbonate (PC), or the like of a white color.

Although the reflector 150 may be provided in a reflective sheet or reflective film shape and be coupled to the circuit board 110 by bonding to the circuit board 110 on which a compensator 140 is provided, a method of forming the reflector 150 is not limited thereto.

For example, the reflector 150 may be formed by a method of depositing a reflective member on the circuit board 110 on which the compensator 140 is provided, or printing or coating the reflective member mixed with the adhesive onto the circuit board 110 on which the compensator 140 is provided by mixing a reflective member with an adhesive.

Figure 6:
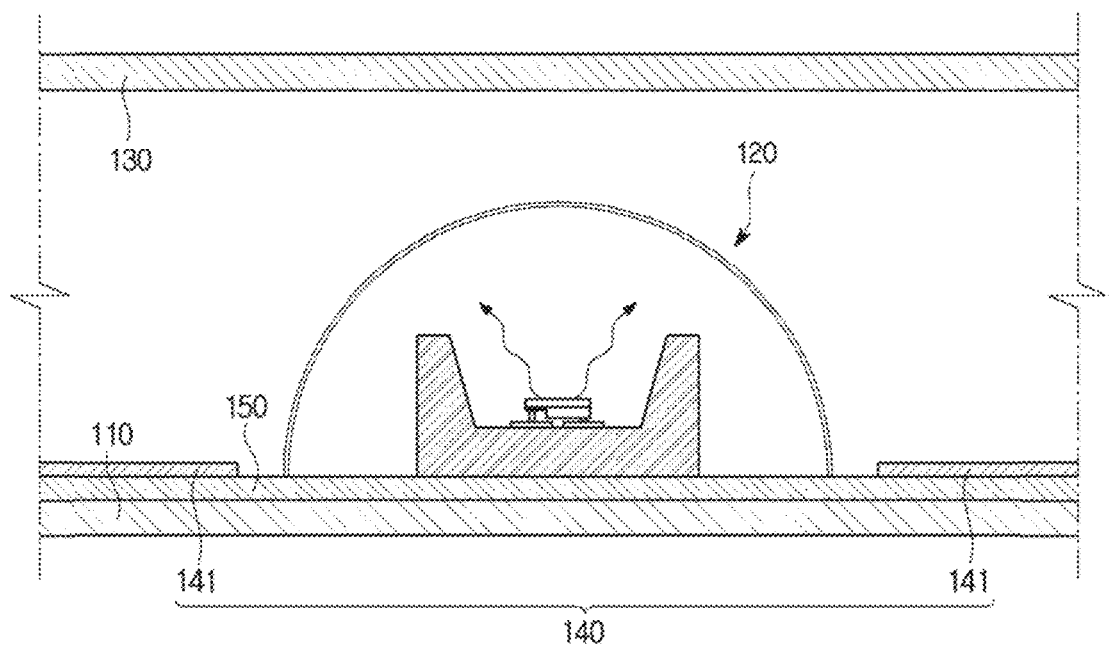
FIG. 6 is a cross-sectional view of a white light emitting device in accordance with still another exemplary embodiment.

FIG. 6 is a cross-sectional view of a white light emitting device 100 in accordance with still another exemplary embodiment.

Referring to FIG. 6, a white light emitting device 100 in accordance with still another exemplary embodiment may include a circuit board 110, a plurality of light sources 120 which are mounted on the circuit board 110 and each emit a monochromatic light, a light converter 130 which converts the monochromatic light ML to white light, a reflective sheet provided on the circuit board 110, and a compensator 140 provided on the reflective sheet.

Although the compensator 140 is provided under the reflector 150 in FIGS. 4 and 5, as shown in FIG. 6, the circuit board 110, a reflector 150, the compensator 140 may be stacked sequentially. In other exemplary embodiments, the circuit board 110, a reflector 150, the compensator 140 may be stacked in any desired order. When the stacking sequence of the white light emitting device 100 is changed, a method of fabricating the white light emitting device 100 may also be changed.

As described above, the reflector 150 is provided in a shape of a reflective sheet or reflective film, and the compensator 140 is provided in a shape of a compensation sheet or compensation film, and the sheet or the film may be stacked sequentially to form a lower part of the white light emitting device 100. However, the method of forming the lower part of the white light emitting device 100 is not limited thereto.

As another exemplary embodiment, a compensator 140 is formed on a reflective sheet or reflective film, and the reflective sheet or the reflective film may be coupled to a circuit board 110 to form a lower part of a white light emitting device 100.

Specifically, the compensator 140 may be formed by a method of coating phosphor members 141 in a regular pattern onto the reflective sheet or the reflective film, or a method of depositing the phosphor members 141 in a regular pattern on the reflective sheet or the reflective film.

In addition, the compensator 140 may also be formed by a method of directly printing the phosphor members 141 onto the reflective sheet or the reflective film. The compensator 140 may be formed by a method of mixing a phosphor with an adhesive configured to fix the phosphor to the reflective sheet or the reflective film in order to form a phosphor ink, and directly printing the phosphor ink formed onto the reflective sheet or the reflective film in order to form the phosphor members 141. Here, the phosphor members 141 may be formed in a regular pattern.

Hereinafter, shapes of phosphor members 141 and an arrangement pattern of phosphor members 141 may be described in detail.

Figure 7:
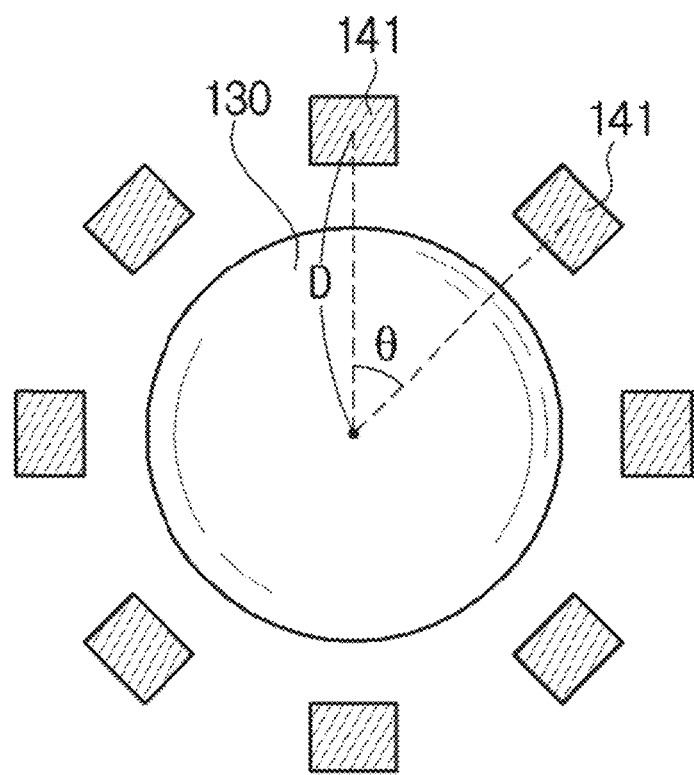
FIG. 7 is a view for describing an arrangement pattern of phosphor members according to one exemplary embodiment.
Figure 8:
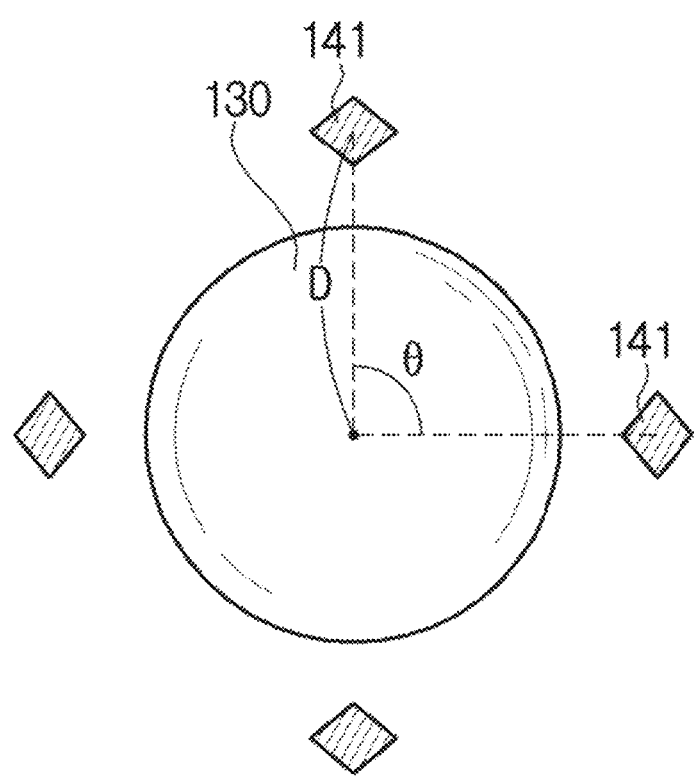
FIG. 8 is a view for describing an arrangement pattern of phosphor members according to another exemplary embodiment.
Figure 9:
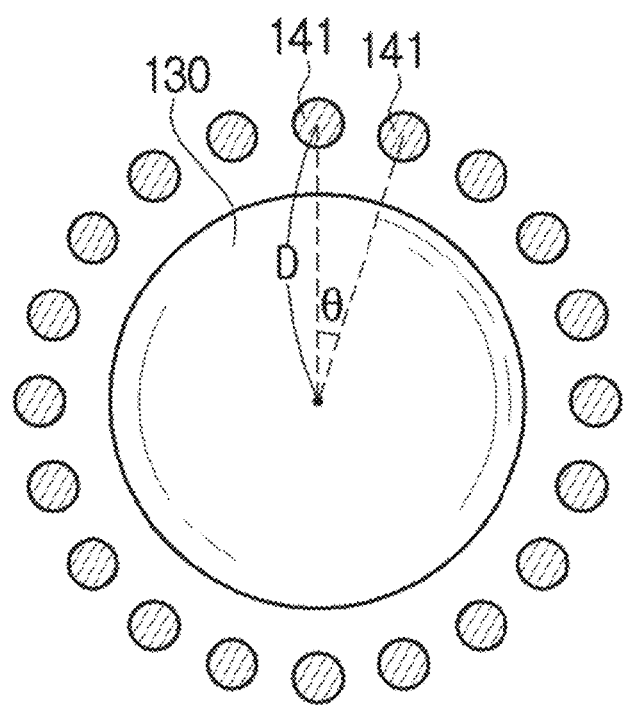
FIG. 9 is a view for describing an arrangement pattern of phosphor members according to still another exemplary embodiment.
Figure 10:
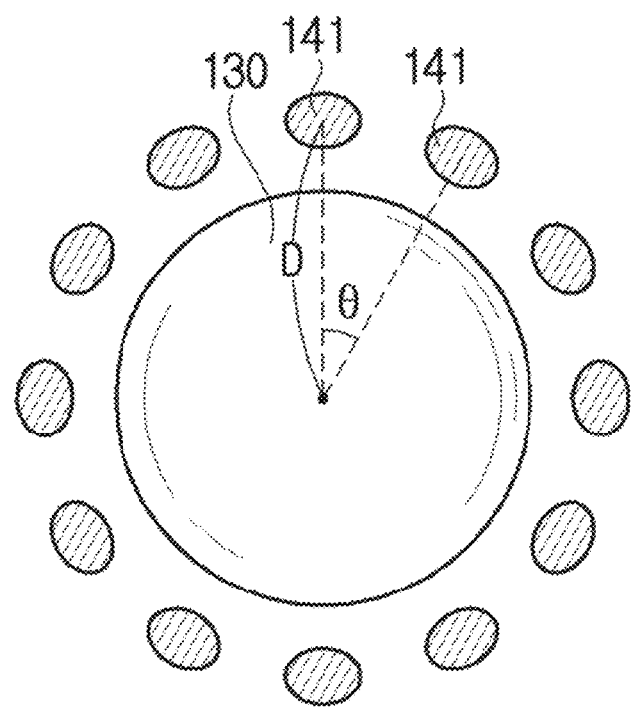
FIG. 10 is a view for describing an arrangement pattern of phosphor members according to yet another exemplary embodiment.

FIG. 7 is a view for describing one exemplary embodiment of an arrangement pattern of phosphor members according to one exemplary embodiment. FIG. 8 is a view for describing an arrangement pattern of phosphor members according to another exemplary embodiment. FIG. 9 is a view for describing an arrangement pattern of phosphor members according to still another exemplary embodiment. FIG. 10 is a view for describing an arrangement pattern of phosphor members according to yet another exemplary embodiment.

Referring to FIGS. 7 to 10, phosphor members 141 may be formed in various shapes. For example, phosphor members 141 may be provided in a rectangular shape as shown in FIG. 7, or in a diamond shape as shown in FIG. 8. In addition, phosphor members 141 may be provided in a circular shape as shown in FIG. 9, or in an ellipsoidal shape as shown in FIG. 10. That is, the phosphor members 141 may be formed in an appropriate shape to reduce a color mura.

In addition, the phosphor members 141 may be arranged in a regular pattern. An arrangement pattern of the phosphor members 141 may be different according to a pattern of the color mura.

That is, the phosphor members 141 may be arranged in a pattern according to the color mura. Here, a pattern of the color mura may be different according to an arrangement of a light source 120, a shape of a lens 122, and a kind of a light emitting device package 121.

In addition, an area of the phosphor member 141 per unit light source may be determined according to a level of the color mura. When the area of the phosphor member 141 is excessively large, the color mura is excessively compensated and color uniformity is degraded, and when the area of the phosphor member 141 is excessively small, the color mura is insufficiently compensated and color uniformity is degraded. Therefore, the area of the phosphor member 141 may be determined according to the level of the color mura.

Specifically, the area of the phosphor member 141 per unit light source may be determined according to a size of the phosphor member 141 and the number of phosphor members 141. That is, when n phosphor members 141 having a size A per the light source 120 are disposed, the area of the phosphor members 141 per the light source is A*n.

Therefore, the size A of the phosphor member 141 may be adjusted according to the level of the color mura, or the number of the phosphor members 141 disposed around a light source may be adjusted to determine a compensation level of the color mura.

As one exemplary embodiment of an arrangement pattern of phosphor members 141, the phosphor members 141 may be arranged in a regular pattern included in a space between a light source 120 and another light source 120. Specifically, as shown in FIGS. 7 to 10, the plurality of phosphor members 141 may be provided at a predetermined distance (D) from the light source 120, and each phosphor member 141 may be arranged to have an interval having a predetermined angle (θ) around the light source 120.

Here, distances between the light source 120 and the phosphor members 141 may be determined according to distances between the plurality of light sources 120. For example, the distance between the light source 120 and the phosphor member 141 may be determined in proportion to a distance between the light source 120 and the light source 120.

Meanwhile although the plurality of phosphor members 141 are arranged in a circular shape in FIGS. 7 to 10, the arrangement of the phosphor members 141 may be different according to a shape of a light source 120, and particularly a shape of a lens 122. For example, when the light source 120 includes the lens 122 which has a rectangular shape, the phosphor members 141 may be arranged in a rectangular shape.

In addition, in FIGS. 7 to 10, while phosphor members 141 are radially arranged around a light source 120, the arrangement pattern of the phosphor members 141 is not limited thereto.

Figure 11:
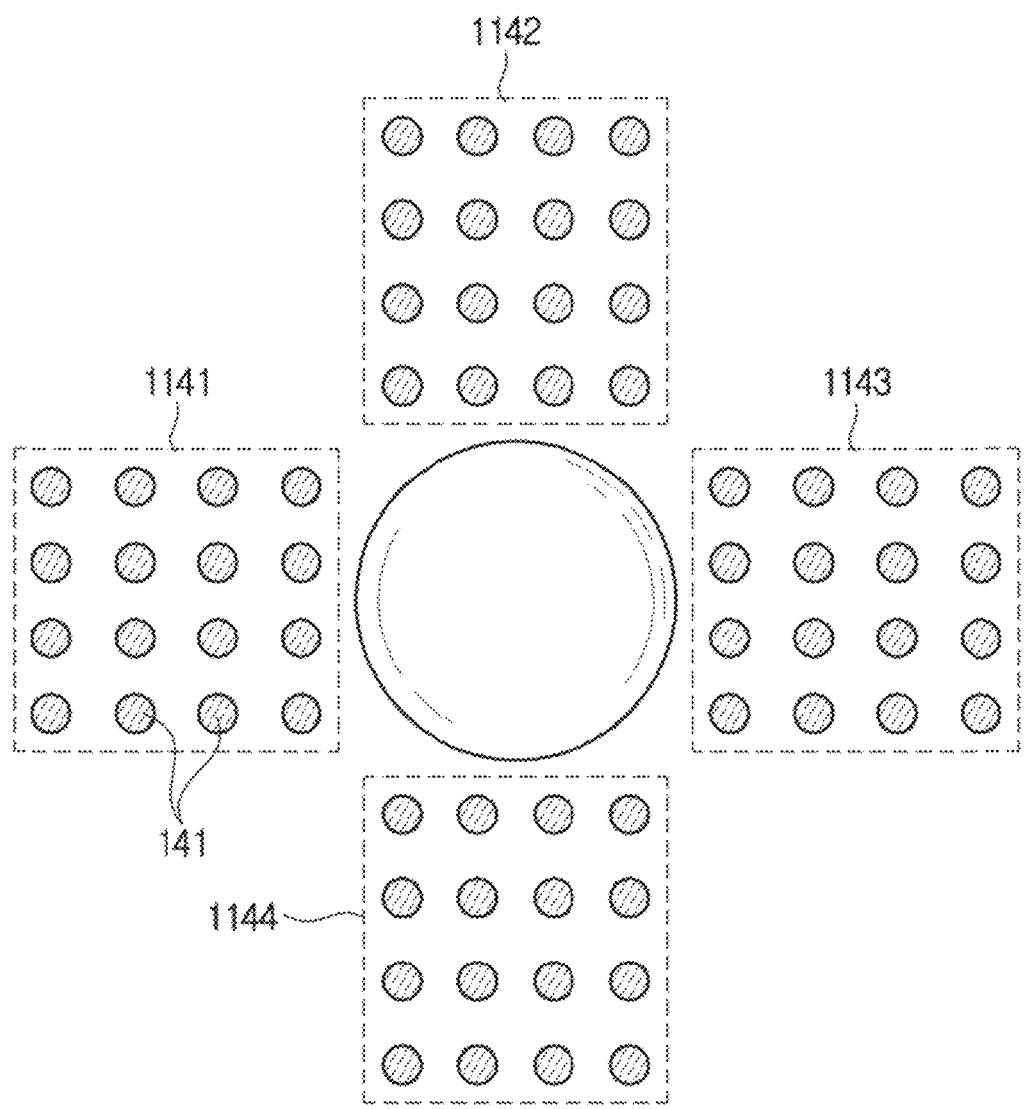
FIG. 11 is a view for describing an arrangement pattern of phosphor members according to yet another exemplary embodiment.
Figure 12:
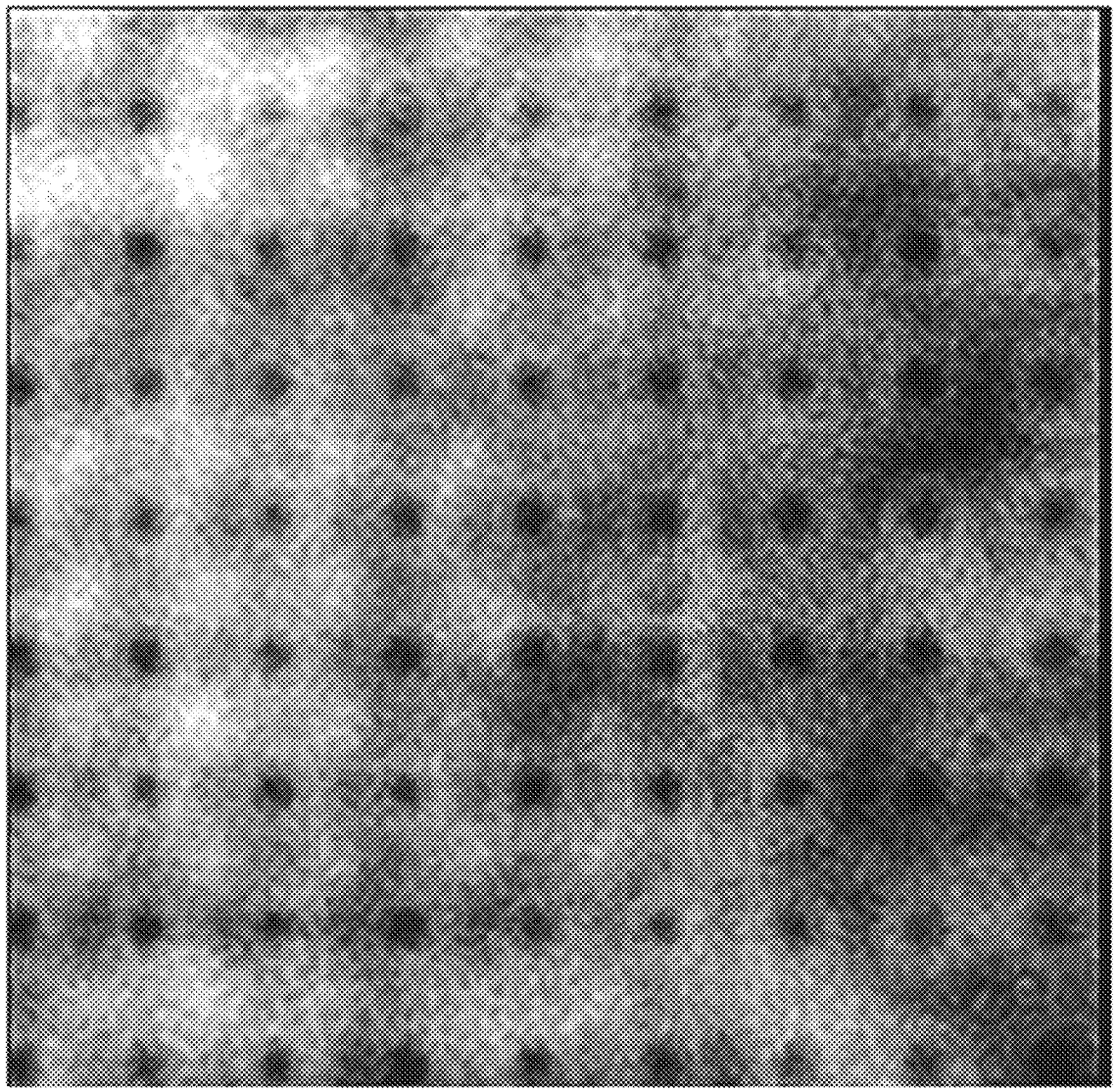
FIG. 12 is a view for describing a pattern of a color mura of a white light emitting device in accordance with one exemplary embodiment.

FIG. 11 is a view for describing an arrangement pattern of phosphor members 141 according to yet another exemplary embodiment. FIG. 12 is a view for describing a pattern of a color mura of a white light emitting device 100 in accordance with one exemplary embodiment.

An arrangement pattern of the plurality of phosphor members 141 may be determined according to a generation pattern of a color mura. As shown in FIG. 1, when light sources 120 are arranged in a lattice pattern, the color mura may also be shown in a lattice pattern as shown in FIG. 12.

Therefore, the arrangement pattern of the phosphor members 141 may also be a lattice pattern as shown in FIG. 11. Specifically, the plurality of phosphor members 141 are arranged in a predetermined distance and in a lattice pattern to make groups 1141, 1142, 1143, and 1144, and each of the groups 1141, 1142, 1143, and 1144 may be vertically and laterally arranged around the light source 120.

Here, the number of the phosphor members 141 and the size of each phosphor member 141 configuring each of the groups 1141, 1142, 1143, and 1144 may be determined according to a level of a color mura as described above.

Meanwhile, as shown in FIG. 12, because a color mura comparatively occurs more in the edge of the white light emitting device 100 compared to the center of the white light emitting device 100, the arrangement pattern of the phosphor members 141 on the edge of the white light emitting device 100 may be different from the other portions.

As described above, because a correction of the color mura is proportional to the area of the phosphor members 141 per unit light source 120, a pattern of the phosphor members 141 may be adjusted so that the area of the phosphor members per unit light source of the edge where the color mura is severe becomes large. This will be described in more detail below with reference to FIGS. 13 to 14.

Figure 13:
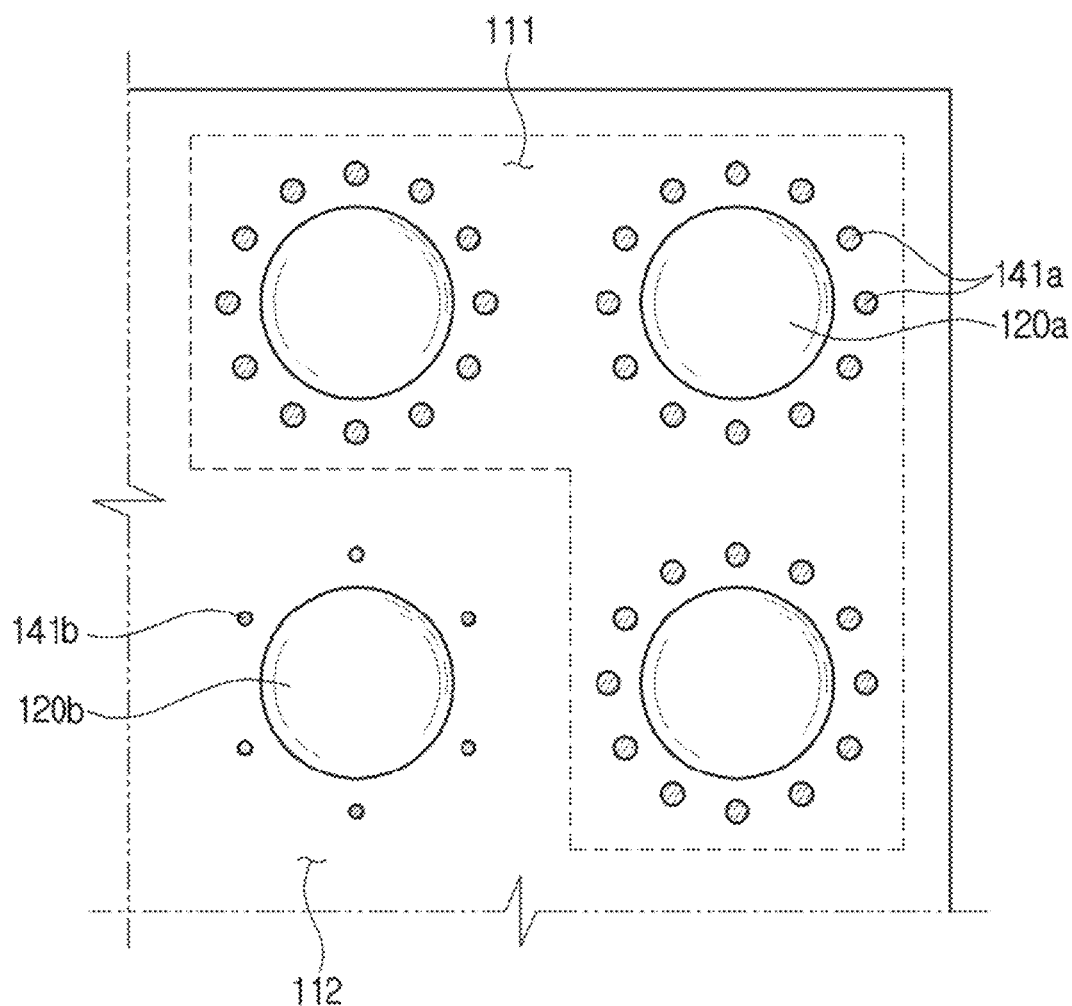
FIG. 13 is a view for describing an arrangement pattern of phosphor members on an edge of the white light emitting device in accordance with one exemplary embodiment.

FIG. 13 is a view for describing an arrangement pattern of phosphor members on an edge of the white light emitting device 100 in accordance with one exemplary embodiment.

As shown in FIG. 13, phosphor members 141a corresponding to a light source 120a located on an edge of a white light emitting device 100 and phosphor members 141b corresponding to a light source 120b located on a center of the white light emitting device 100 have different sizes.

That is, the size of the phosphor member 141a corresponding to the light source 120a located on the edge may be greater than that of the phosphor member 141b corresponding to the light source 120b located on the center so that a color mura is further compensated on the edge where the color mura is comparatively severely generated.

Meanwhile, because the area of phosphor members per light source is influenced by the number of the phosphor members, the number of the phosphor members 141a corresponding to the light source 120a located on the edge may be greater than that of the phosphor members 141b corresponding to the light source 120b located on the center.

Figure 14:
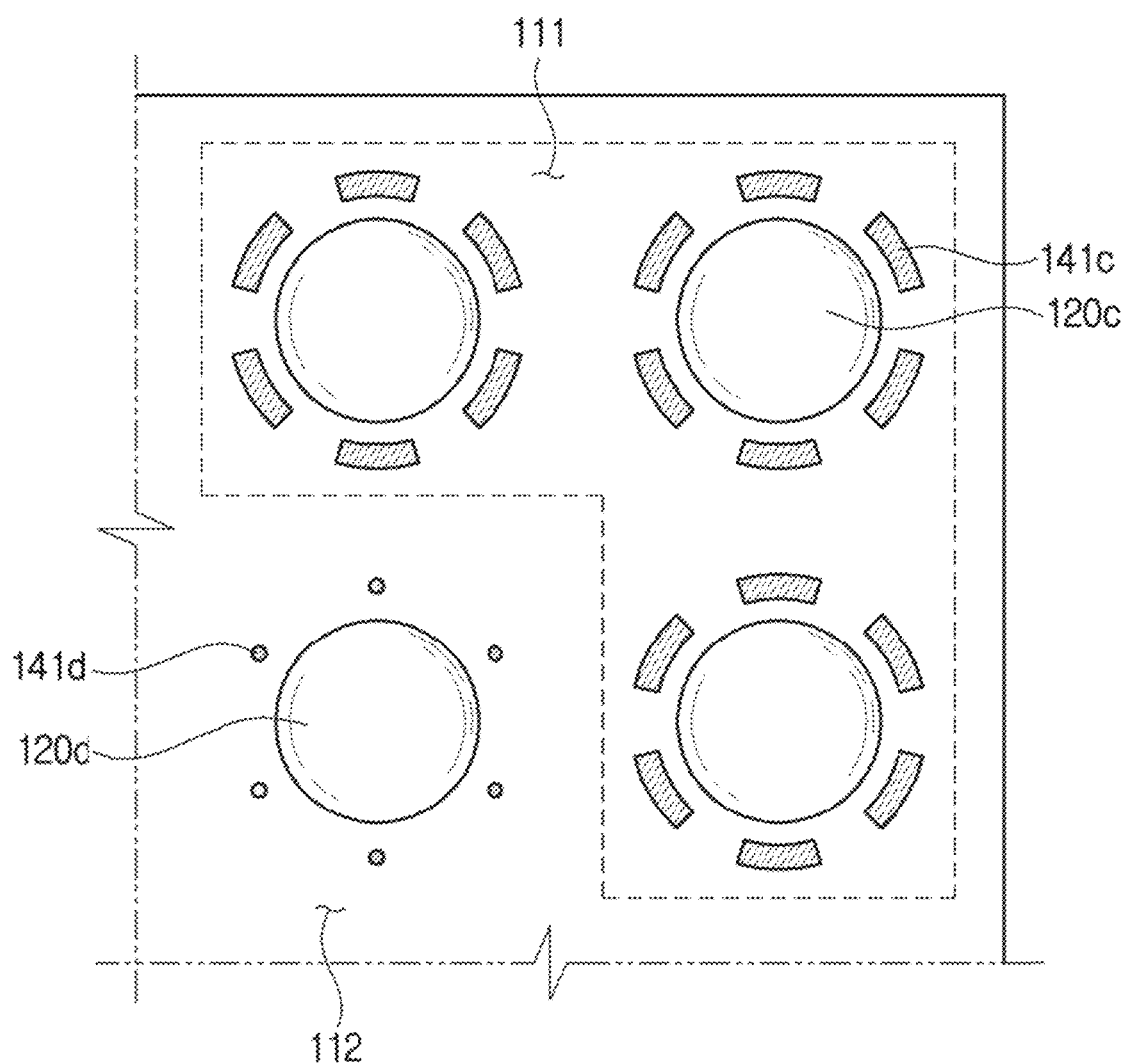
FIG. 14 is a view for describing an arrangement pattern of phosphor members on an edge of the white light emitting device in accordance with another exemplary embodiment.

FIG. 14 is a view for describing an arrangement pattern of phosphor members on an edge of the white light emitting device 100 in accordance with another exemplary embodiment.

Referring to FIG. 14, phosphor members 141c corresponding to a light source 120c located on an edge of a white light emitting device 100 and phosphor members 141d corresponding to a light source 120d located on a center of the white light emitting device 100 may have different shapes.

The phosphor members 141d corresponding to the light source 120d located on the center of the white light emitting device 100 may be a circular shape, and the phosphor members 141c corresponding to a light source 120c located on the edge may be polygonal shape so that a color mura is further compensated on the edge where the color mura is comparatively severely generated.

Meanwhile although the phosphor members 141 are located between the light source 120 and another light source 120 in FIGS. 1 to 14, the dispositions of the phosphor members 141 are not limited thereto. Hereinafter, arrangement positions of the phosphor members 141 will be described.

Figure 15:
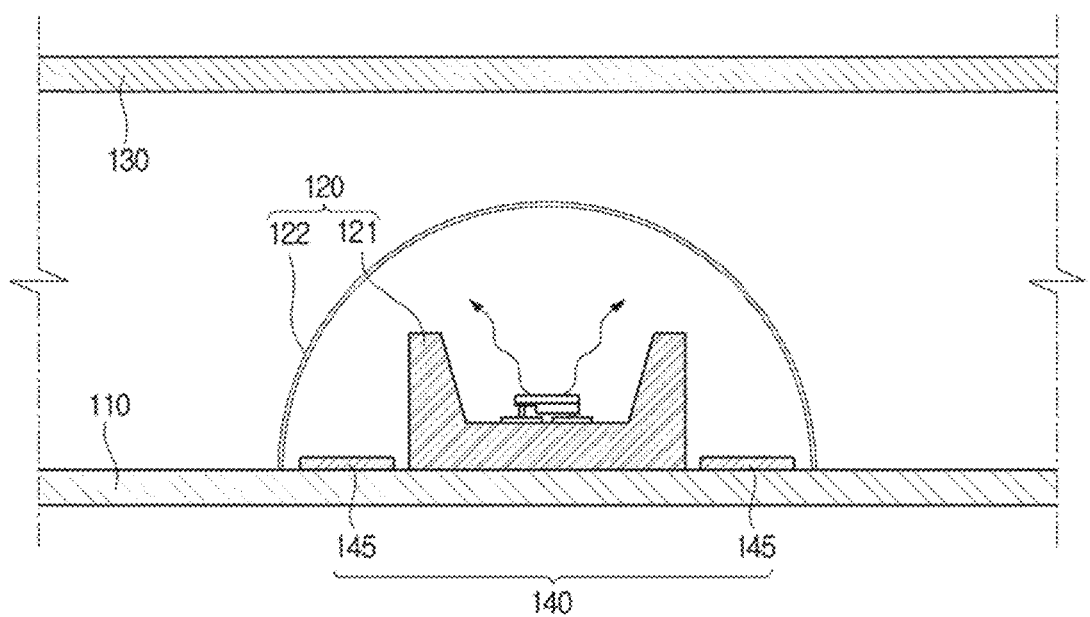
FIG. 15 is a cross-sectional view for describing an arrangement position change of phosphor members of a white light emitting device in accordance with one exemplary embodiment.
Figure 16:
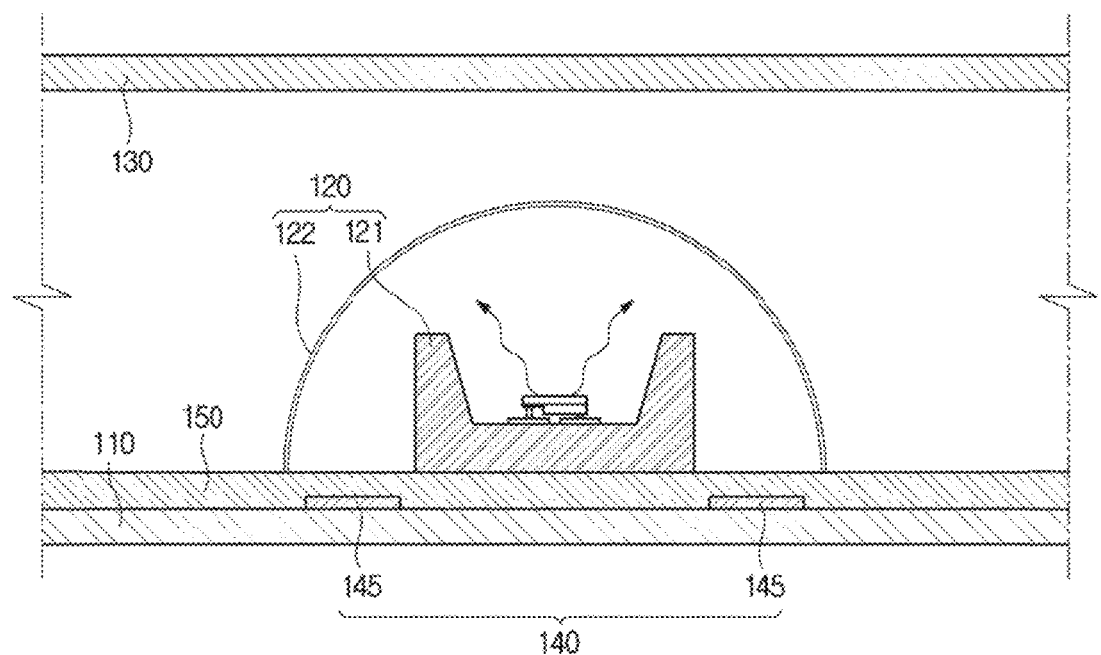
FIG. 16 is a cross-sectional view for describing an arrangement position change of phosphor members of a white light emitting device in accordance with another exemplary embodiment.
Figure 17:
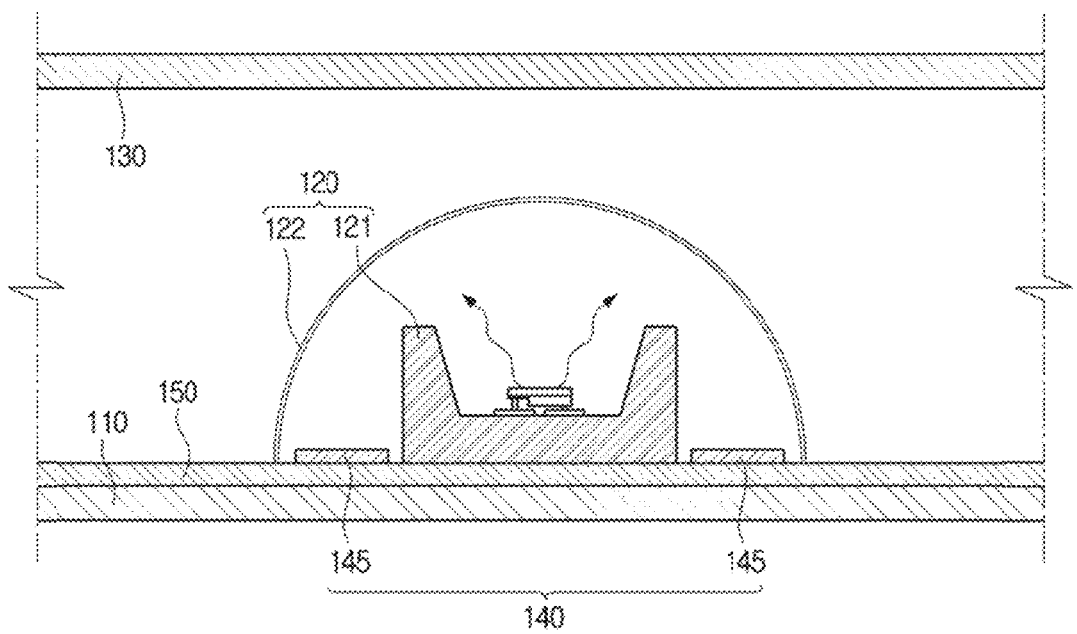
FIG. 17 is a cross-sectional view for describing an arrangement position change of phosphor members of a white light emitting device in accordance with still another exemplary embodiment.

FIG. 15 is a cross-sectional view for describing an arrangement position change of phosphor members of a white light emitting device in accordance with one exemplary embodiment. FIG. 16 is a cross-sectional view for describing an arrangement position change of phosphor members of a white light emitting device in accordance with another exemplary embodiment. FIG. 17 is a cross-sectional view for describing an arrangement position change of phosphor members of a white light emitting device in accordance with still another exemplary embodiment.

Referring to FIGS. 15 to 17, phosphor members 145 provided inside a light source 120 may convert a monochromatic light refracted and reflected inside of the light source 120 to white light. Here, the phosphor members 145 may be disposed between a light emitting device package 121 and a lens 122.

More specifically, as shown in FIGS. 15 to 17, the phosphor members 145 may be provided on a space where the lens 122 and the light emitting device package 121 are not seated. Here, the phosphor members 145 provided inside the light source 120 may be arranged in a regular pattern.

Figure 18:
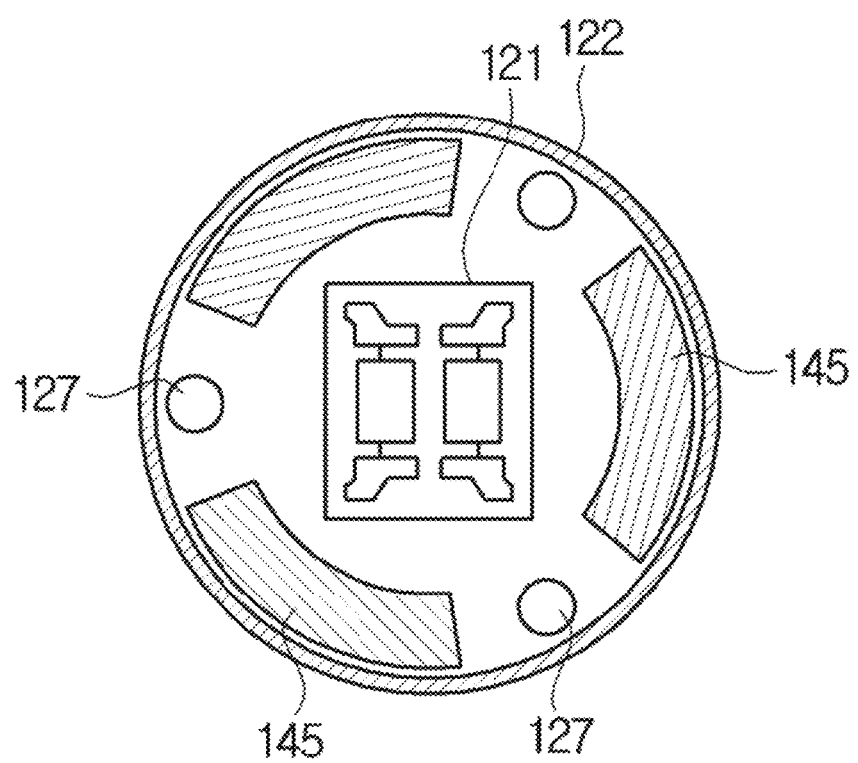
FIG. 18 is a view for describing an arrangement pattern of phosphor members according to yet another exemplary embodiment.
Figure 19:
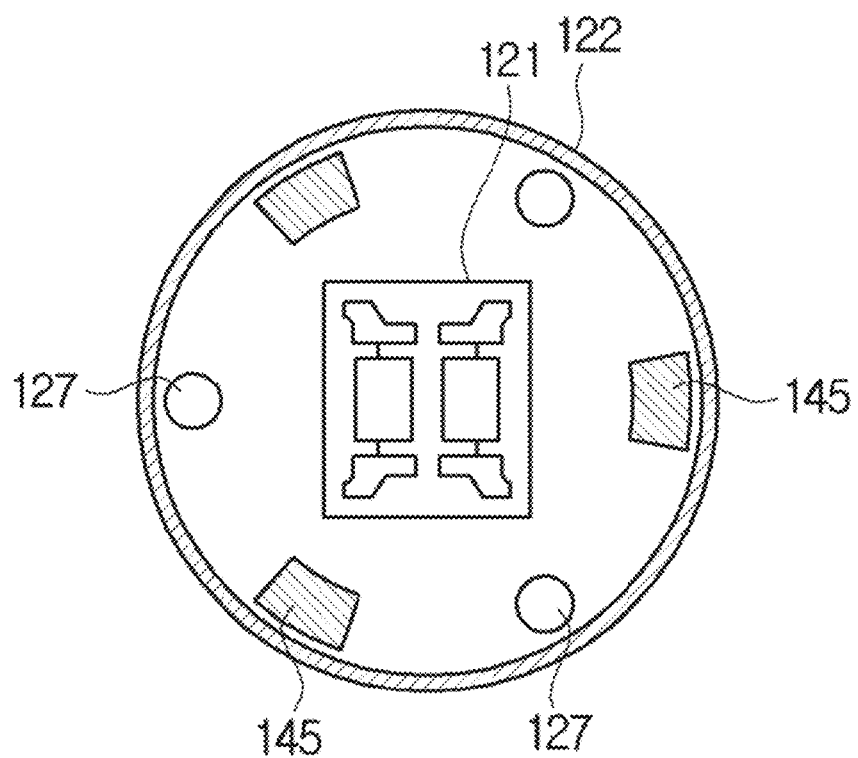
FIG. 19 is a view for describing an arrangement pattern of phosphor members according to yet another exemplary embodiment.
Figure 20:
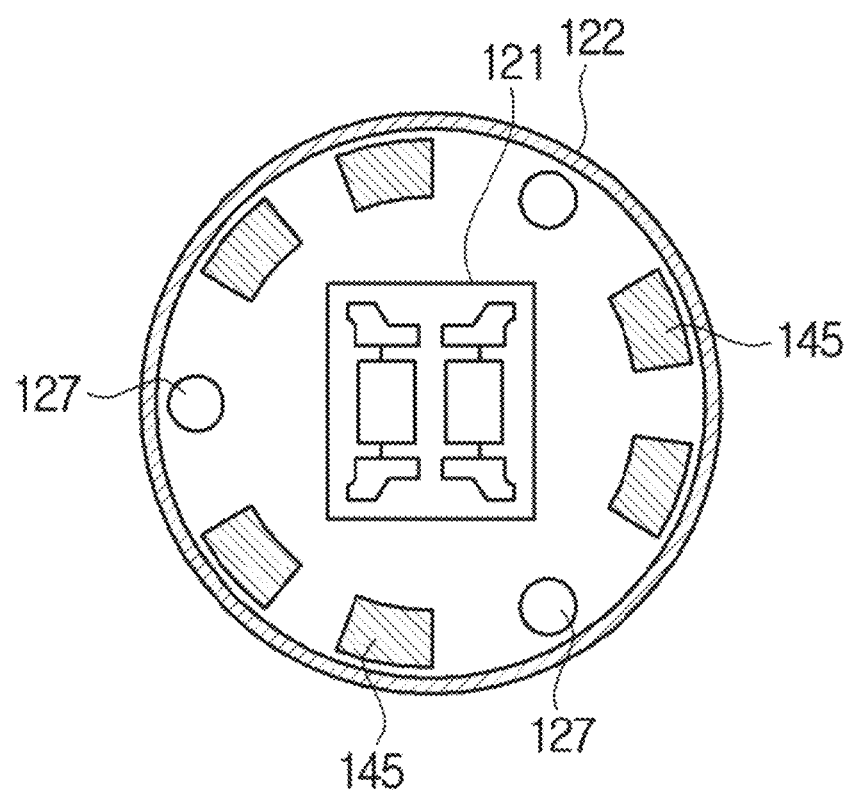
FIG. 20 is a view for describing an arrangement pattern of phosphor members according to yet another exemplary embodiment.

FIG. 18 is a plan view of a light source for describing an arrangement pattern of phosphor members according to yet another exemplary embodiment. FIG. 19 is a plan view of a light source for describing an arrangement pattern of phosphor members according to yet another exemplary embodiment. FIG. 20 is a plan view of a light source for describing an arrangement pattern of phosphor members according to yet another exemplary embodiment.

Referring to FIGS. 2 and 18 to 20, a light emitting device package 121 is provided inside a lens 122. The lens 122 may be fixed on a circuit board 110 by a supporter 127 disposed in an angle of 120 degrees.

Phosphor members 145 are provided in a space between the lens 122 and the light emitting device package 121. As shown in FIGS. 18 to 20, the phosphor members 145 may be arranged in spaces between supporters 127.

As described above, because the compensation of a color mura is proportional to the area of the phosphor members 145 per unit light source 120, the area of the phosphor member 145 and the number of the phosphor members 145 existing inside the light source 120 may be different according to the compensation of the color mura.

Figure 21:
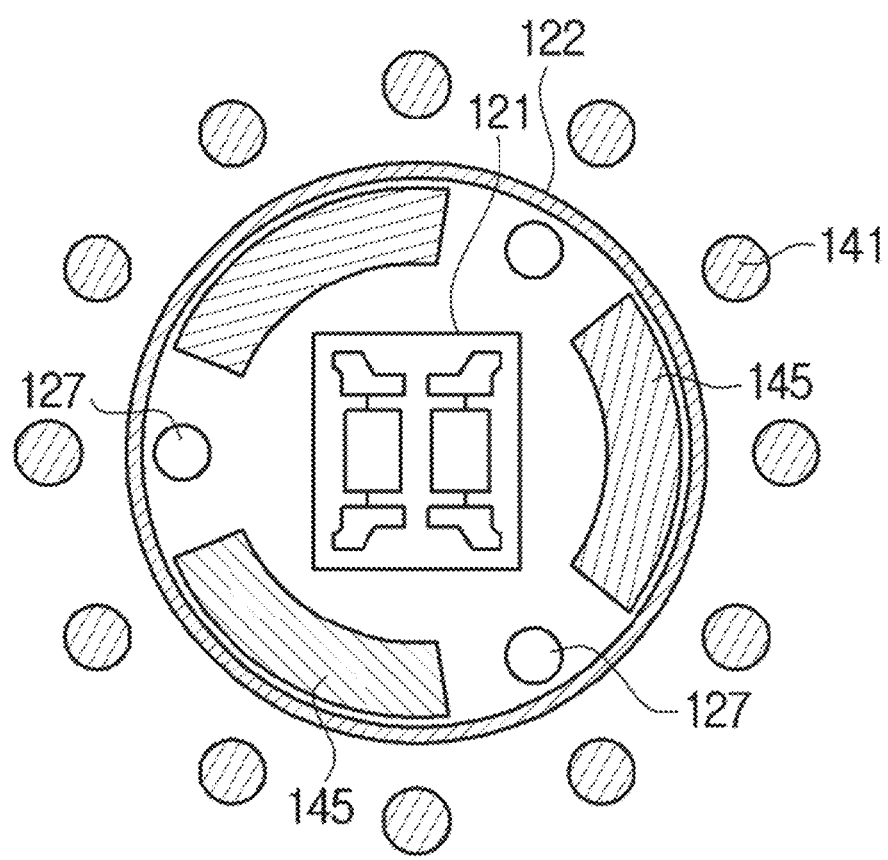
FIG. 21 is a view for describing an arrangement pattern of phosphor members according to yet another exemplary embodiment.

FIG. 21 is a view for describing an arrangement pattern of phosphor members according to yet another exemplary embodiment.

As shown in FIG. 21, a compensator may include first phosphor members 141 provided between the light source 120 and another light source, and second phosphor members 145 existing inside the light source 120.

Shapes and sizes of the first phosphor member 141 and the second phosphor member 145 may be determined according to a level of a color mura as described above. Here, the first phosphor members 141 and the second phosphor members 145 may have different shapes. For example, the first phosphor members 141 may be provided in a circular shape, and the second phosphor members 145 may be provided in a fan shape in which an inside thereof is cut. In addition, the first phosphor members 141 and the second phosphor members 145 may have different sizes.

In addition, the first phosphor members 141 and the second phosphor members 145 may also have different arrangement patterns. For example, the first phosphor members 141 may be disposed in an angle of 30 degrees and in a circular shape, the second phosphor members 145 may be disposed in an angle of 120 degrees.

Figure 22:
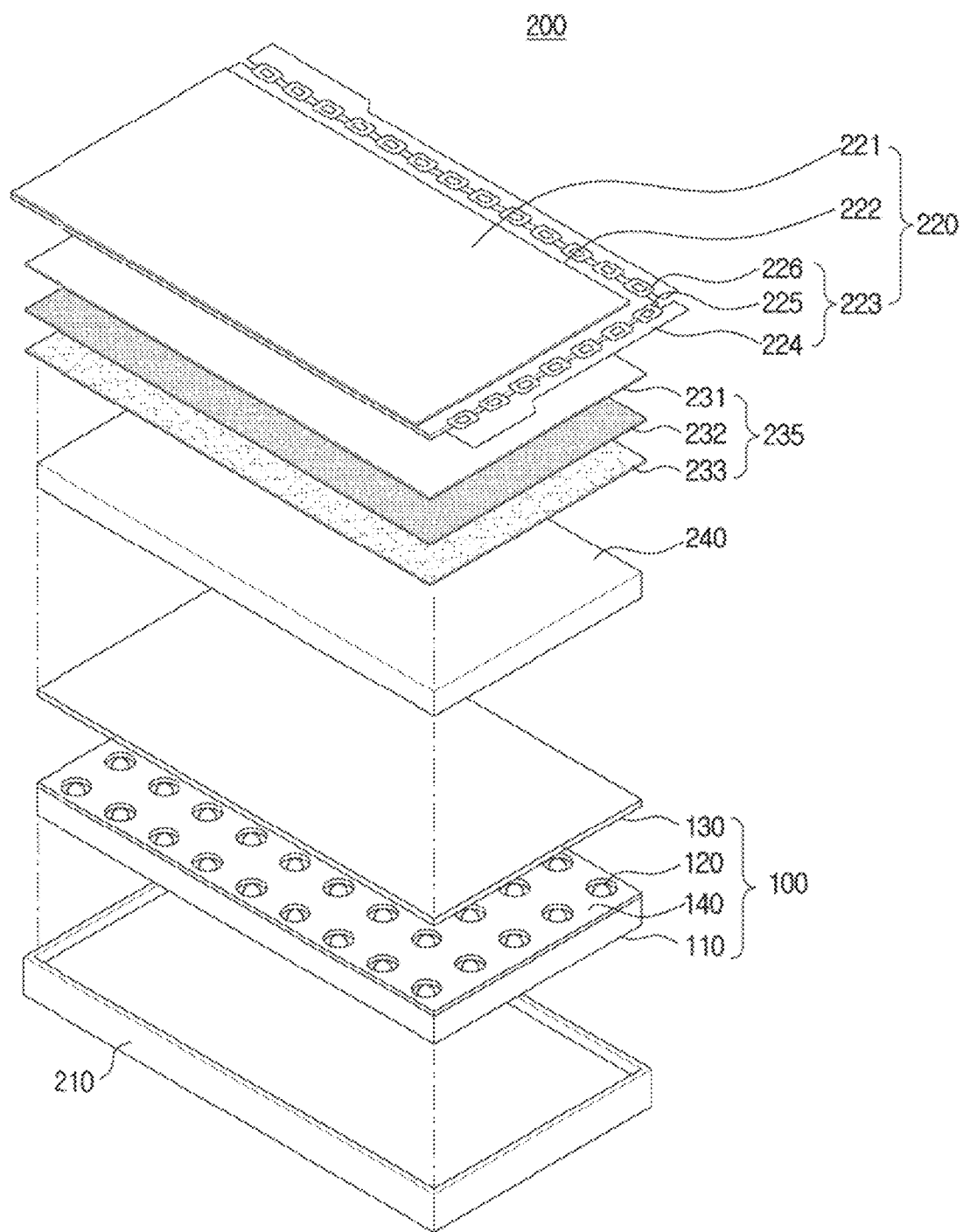
FIG. 22 is an exploded perspective view of a display device in accordance with one exemplary embodiment.

FIG. 22 is an exploded perspective view of a display device in accordance with one exemplary embodiment. FIG. 23 is an exploded perspective view of a display device in accordance with another exemplary embodiment.

Referring to FIGS. 22 and 23, a display device 200 in accordance with one exemplary embodiment includes a frame 210, a liquid crystal panel 220, an optical part 235, a diffusion plate 240, and a white light emitting device 100.

The frame 210 accommodates the liquid crystal panel 220, the optical part 235, and the white light emitting device 100. The frame 210 may have a square frame shape, and may be formed of a plastic or reinforced plastic.

A chassis which surrounds the frame 210 and supports a backlight assembly may be disposed under or on sides of the frame 210 to improve the durability and the fire resistance of the frame 210.

The liquid crystal panel 220 may adjust an arrangement of a liquid crystal layer which refracts white light incident from a white light emitting unit in different patterns to generate an image to be displayed to a user. To this end, the liquid crystal panel 220 may further include a thin plate transistor substrate 221 and a color display substrate 222 in which a liquid crystal layer is provided between the thin film transistor substrate 221 and the color display substrate 222.

The thin plate transistor substrate 221 and the color display substrate 222 may be spaced a certain distance from each other. A color filter and a black mattress may be provided on the color display substrate 222. A driver 223 configured to transmit a driving signal to the thin film transistor substrate 221 may be installed on the thin film transistor substrate 221. The driver 223 may include a first substrate 224, a driving chip 225 connected to the first substrate 224, a second substrate 226 on which the driving chip 225 is installed. The second substrate 226 in accordance with an exemplary embodiment may be a printed circuit board or a flexible printed circuit board (FPCB) 110.

In addition to the liquid crystal panel 220 described above, various panels which may be considered by those skilled in the art may be one exemplary embodiment of the liquid crystal panels 220.

As desired, in the liquid crystal panel 220, a touch panel which includes a polyester film, glass, and the like may be installed to sense a touch operation or a polaroid film may be further installed to polarize light transmitted to the outside through the liquid crystal panel 220.

The optical part 235 is provided between the liquid crystal panel 220 and the white light emitting device 100. The optical part 235 diffuses and collects white light guided by the diffusion plate 240 and transmits the white light to the liquid crystal panel 220.

The optical part 235 may include a diffusion sheet 233 and prism sheets 231 and 232. The diffusion sheet 233 serves to diffuse light emitted by the diffusion plate 240, and the prism sheets 231 and 232 serve to collect the light diffused by the diffusion sheet 233 to supply the uniform light to the liquid crystal panel 220.

The diffusion sheet 233 diffuses and outputs incident light. Further uniform white light may be provided to the liquid crystal panel 220 by the diffusion sheet 233. The diffusion sheet 233 may be omitted or configured with a plurality of sheets as desired.

The prism sheets 231 and 232 may include a first prism sheet 231 and a second prism sheet 232 in which prisms vertically intersect in x and y axes directions. When the prism sheets 231 and 232 refract light from x and y axes directions, the linearity of the light may be improved.

The diffusion plate 240 diffuses and outputs white light emitted by the white light emitting device 100. That is, the white light emitted by the white light emitting device 100 is further diffused while passing through the diffusion plate 240. Therefore, the white light may be diffused to further improve brightness uniformity.

Specifically, the diffusion plate 240 may be provided in a plate shape. For example, the diffusion plate 240 may be implemented with a translucent acrylic plate having a 1~2.5 mm thickness, and serve to uniformly diffuse the white light emitted by the white light emitting device 100.

The white light emitting device 100 described above may be applied to a display device 200. The white light emitting device 100 may provide a backlight to the liquid crystal panel 220 described above.

Specifically, as described above, the white light emitting device 100 may include a circuit board 110, a plurality of light sources 120, which each emit a monochromatic light ML, mounted on the circuit board 110, a light converter 130 converting the monochromatic light to white light, and a compensator 140 provided between the plurality of light sources 120 in order to reduce a color mura.

The light sources 120 may be provided in a package type and the plurality of light sources 120 may be mounted on the circuit board 110. In FIGS. 22 and 23, although the light sources 120 are arranged in a lattice pattern, an arrangement pattern of the light sources may be changed in various shapes as desired.

Here, the light source 120 generates and emits a monochromatic light. For example, the light source 120 may emit blue light generated by a blue LED. Here, blue light generated by a blue LED may be emitted in a wide beam angle through the lens (122 of FIG. 2) described above.

A monochromatic light emitted by the light source 120 is converted to white light while passing through the light converter 130. To this end, the light converter 130 may include a phosphor. For example, the light converter 130 may include a yellow light emitting phosphor having a complementary color of blue light. In addition, the light converter 130 may include a light phosphor and a green light emitting phosphor instead of a yellow light emitting phosphor to generate white light.

White light transmitted by the light converter 130 reaches the liquid crystal panel 220 passing through the diffusion plate 240 and the optical part 235. Therefore, the liquid crystal panel 220 uses white light provided by the white light emitting device 100 as a backlight to display a predetermined image.

Here, the refraction, reflection, and diffraction of light may occur inside the display device 200 and the white light emitting device 100. Therefore, a color mura may occur in white light emitted by the white light emitting device 100 according to a change of a light path.

Thus, the compensator 140 may be located between the circuit board 110 and the light converter 130, and convert a monochromatic light, which is refracted, reflected, and rotated, to white light to compensate the color mura.

As described above, the compensator 140 may include phosphor members 141 which may be arranged in various patterns of shapes. The phosphor members 141 may include a phosphor. The phosphor members 141 convert part of the monochromatic light incident to the compensator 140 to output the white light.

The phosphor included in the phosphor member 141 may be the same as the phosphor of the light converter 130 described above. For example, the phosphor members 141 may include a yellow light emitting phosphor having a complementary color of blue light. In addition, the phosphor members 141 may include a light phosphor and a green light emitting phosphor instead of a yellow light emitting phosphor to generate white light.

As described above, the phosphor members 141 may be provided between the light source 120 and the light source 120, but also provided inside the light source 120. In addition, the phosphor members 141 may be provided both inside and between the light sources 120.

In addition, an arrangement pattern of the phosphor members 141 may be different according to a generation pattern of a color mura as described above.

In addition, because a level of the color mura may be more severe on an edge of a display part compared to a center of a display part, a pattern of the phosphor members 141 of the edge of the display part and a pattern of the phosphor members 141 of the center of the display part display may be different from each other.

In addition, a shape and a size of the respective phosphor members 141 may be determined according to the level of the color mura, and the compensator 140 may include the plurality of phosphor members 141 having different shapes.

Here, as shown in FIG. 22, the compensator 140 may be provided in a compensation sheet shape or a compensation film shape including the phosphor members 141, and be formed by bonding the compensation sheet or the compensation film to the circuit board 110.

In addition, as shown in FIG. 23 a compensator 140 in accordance with another exemplary embodiment may be directly formed on a circuit board 110. Specifically, the compensator 140 may be formed by a method of coating phosphor members 141 in a regular pattern onto the circuit board 110, or a method of depositing the phosphor members 141 in a regular pattern on the circuit board 110.

In addition, the compensator 140 may be formed by a method of directly printing the phosphor member 141 on the circuit board 110. Specifically, the compensator 140 may be formed by a method of mixing a phosphor with an adhesive configured to fix the phosphor to the circuit board 110 in order to form a phosphor ink, and directly printing the phosphor ink formed on the circuit board 110 to form the phosphor members 141.

In addition, as shown in FIGS. 5 and 6, a white light emitting device 100 may further include a reflector 150. The reflector 150 may be stacked on a circuit board 110, and reflect light emitted by a light source 120 toward a light converter 130 to increase the utilization rate of the light source 120. Here, the reflector 150 may be provided in a reflective sheet or reflective film type.

When the reflector 150 is provided in the reflective sheet or reflective film type, a compensator 140 may be directly formed on a reflective sheet or film.

Specifically, the compensator 140 may be formed by a method of coating phosphor members 141 in a regular pattern onto the reflective sheet or the reflective film, or a method of depositing the phosphor members 141 in a regular pattern on the reflective sheet or the reflective film.

In addition, the compensator 140 may be formed by a method of directly printing the phosphor members 141 on the reflective sheet or the reflective film. The compensator 140 may be formed by a method of mixing a phosphor with an adhesive configured to fix the phosphor to the reflective sheet or the reflective film to form a phosphor ink, and directly printing the phosphor ink formed on the reflective sheet or the reflective film to form the phosphor members 141. Here, the phosphor members 141 may be formed in a regular pattern.

Hereinafter, a white LED including a plurality of light source modules will be specifically described in accordance with accompanying drawings. The same numerals are generally assigned to components which are the same as that of the exemplary embodiments described above, and a specific description thereof will be omitted.

Figure 24:
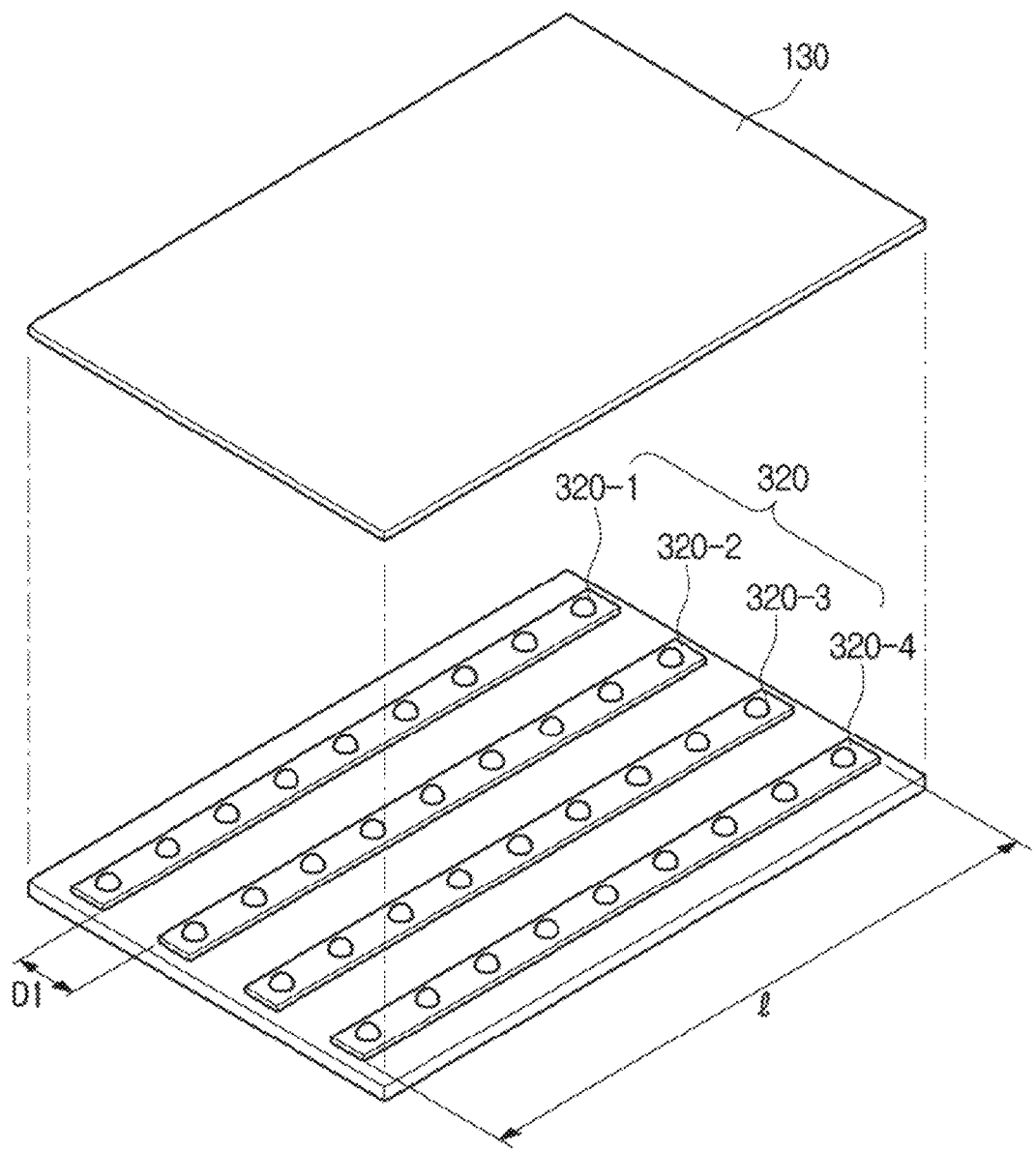
FIG. 24 is a schematic exploded perspective view of a white light emitting device including a plurality of light source module.
Figure 25:
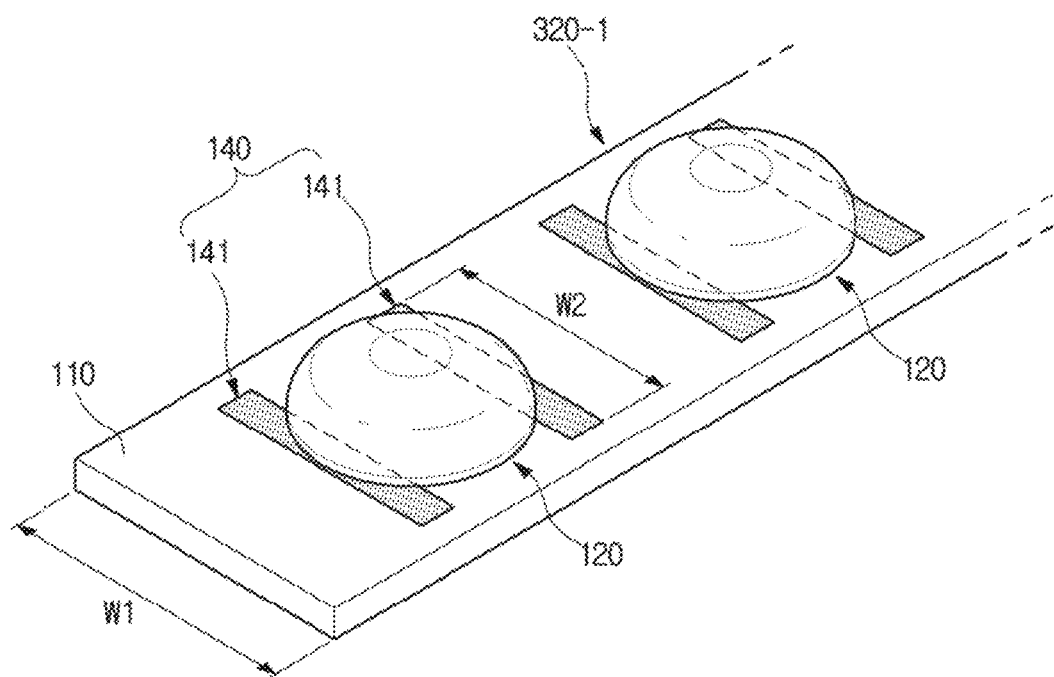
FIG. 25 is a schematic perspective view for describing a light source module.
Figure 26:
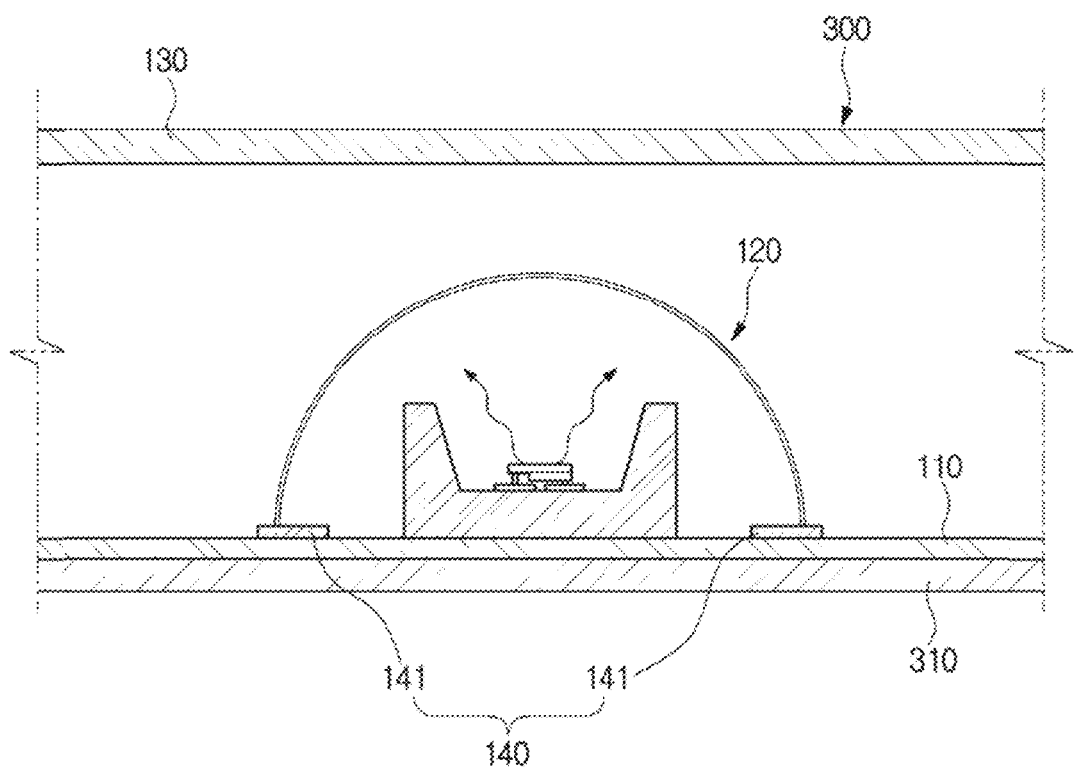
FIG. 26 is a cross-sectional view of a white light emitting device.
Figure 27:
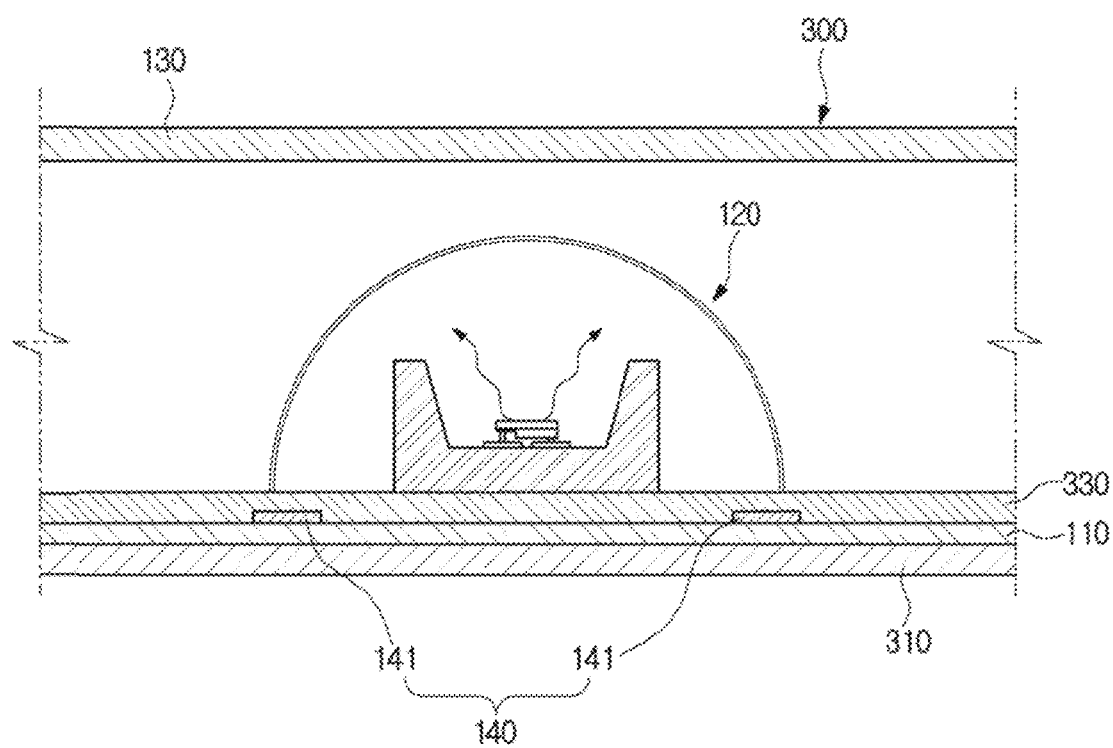
FIG. 27 is a cross-sectional view of a white light emitting device which further includes a coated layer.

FIG. 24 is a schematic exploded perspective view of a white light emitting device including a plurality of light source modules, FIG. 25 is a schematic perspective view for describing a light source module, FIG. 26 is a cross-sectional view of a white light emitting device, and FIG. 27 is a cross-sectional view of a white light emitting device which further includes a coated layer.

Referring to FIG. 24, a white light emitting device includes a base, a plurality of light source modules 320 emitting a monochromatic light, and a light converter 130 converting the monochromatic light emitted from the plurality of light source modules 320 to white light.

The light source modules 320 are coupled on the base 310. The base 310 may be formed of a plastic or a reinforced plastic, but it is not limited thereto.

In addition, the base 310 may be omitted as desired, or be replaced with a different component. For example, the frame 210 illustrated in FIG. 22 may become the base 310. That is, the plurality of light source modules 320 may be coupled to the frame 210.

In addition, a reflective member is provided on a surface of the base 310 to reflect a monochromatic light incident through the light source module 320 toward the light converter 130.

The light converter 130 converts a monochromatic light to white light. The light converter 130 is spaced a certain distance from the light source module 320, converts a monochromatic light emitted from the light source module 320 to white light, and emits the white light forward. To this end, the light converter 130 may include a phosphor which converts a wavelength of an incident monochromatic light and emits a monochromatic light having a different color.

The plurality of light source modules 320 may be spaced a certain distance D1 from each other. At this time, distances between the light source modules 320 may be the same, but the distances between the light source modules 320 may be different from each other when it is required. For example, a distance between a second light source module 320-2 and a third light source module 320-3 may be smaller than that of a first light source module 320-1 and the second light source module 320-2, but it is not limited thereto.

Referring to FIGS. 25 and 26, the light source module 320_1 includes a circuit board 110, compensators 140, and a plurality of light sources 120.

The plurality of light sources 120 are mounted on the circuit board 110. The circuit board 110 may be provided in a long bar shape.

The length L of the circuit board 110 may be determined to correspond to the length of the white light emitting device 300, the width W1 of the circuit board 110 may be determined to correspond to the width of the light source 120. Specifically, as illustrated in FIG. 25, the width W1 of the circuit board 110 may be greater than the width W2 of the light source 120, but is not limited thereto, and may have a width in which a light emitting device package of the light source 120 may be mounted.

The plurality of light sources 120 are mounted on the circuit board 110 with a certain interval, and emit a monochromatic light. The intervals between the plurality of light sources 120 may be the same, but the plurality of light sources 120 may be also disposed with the intervals different from each other.

The compensator 140 is provided between the light converter 130 and the circuit board 110 to improve the color uniformity of the white light emitting device 300. Specifically, the compensator 140 converts an incident monochromatic light to white light and output the white light to reduce a color mura of the white light emitting device 300.

The compensator 140 may include a plurality of phosphor members 141 which convert an incident monochromatic light to white light and output the white light. At this time, the phosphor member 141 may include a phosphor which is formed of at least one phosphor material and converts a wavelength of an incident monochromatic light. Phosphor material forming the phosphor member 141 may be determined according to a monochromatic light incident from the light source 120.

The compensator 140 may be provided by a method of forming the plurality of phosphor members 141 on the circuit board 110. Specifically, the compensator 140 may be formed by a method of coating the phosphor members 141 in a regular pattern on the circuit board 110, or a method of depositing the phosphors members 141 in a regular pattern on the circuit board 110.

In addition, the compensator 140 may be also formed by a method of directly printing the phosphor member 141 on the circuit board 110. Specifically, the compensator 140 may be formed by a method of mixing a phosphor with an adhesive for fixing the phosphor to the circuit board 110 to form a phosphor ink, and directly printing the formed phosphor ink on the circuit board 110 to form the phosphor member 141.

The phosphor member 141 may be provided inside or outside the light source 120, but the position of the phosphor member 141 is not limited thereto. For example, as described above, the phosphor member 141 may be formed inside the light source 120 or outside the light source 120 as described above, or may be formed inside and outside the light source 120.

The phosphor member 141 may be formed in a various shapes. For example, as illustrated in FIG. 25, the phosphor member 141 may be formed in a rectangular shape. At this time, the length of the phosphor member 141 may correspond to the width D2 of the light source 120 or the width D1 of the circuit board 110, but it is not limited thereto.

The plurality of phosphor members 141 may be formed to have a certain pattern. For example, as illustrated in FIG. 25, the phosphor member 141 may be formed to have a certain interval in a longitudinal direction of the light source module 320-1, but the pattern of the phosphor member 141 is not limited thereto.

Meanwhile, as illustrated in FIG. 27, the white light emitting device 300 may further include a coated layer 330 which is transparent. The coated layer 330 may be stacked on the circuit board 110, in which the phosphor member 141 is formed, to prevent the phosphor member 141 and the circuit board 110 from being damaged.

Figure 28:
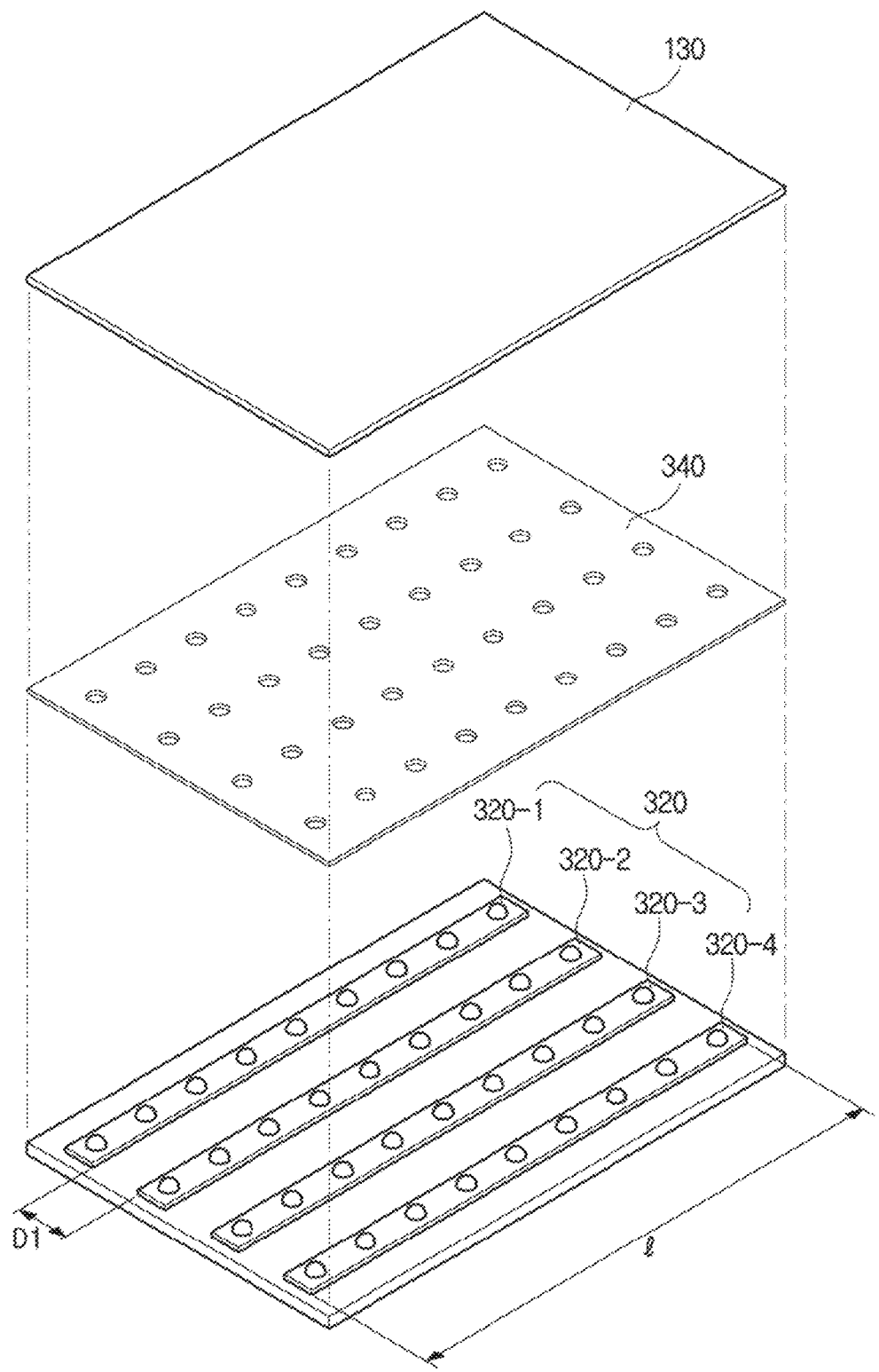
FIG. 28 is an exploded perspective view of a white light emitting device which further includes a reflector.
Figure 29:
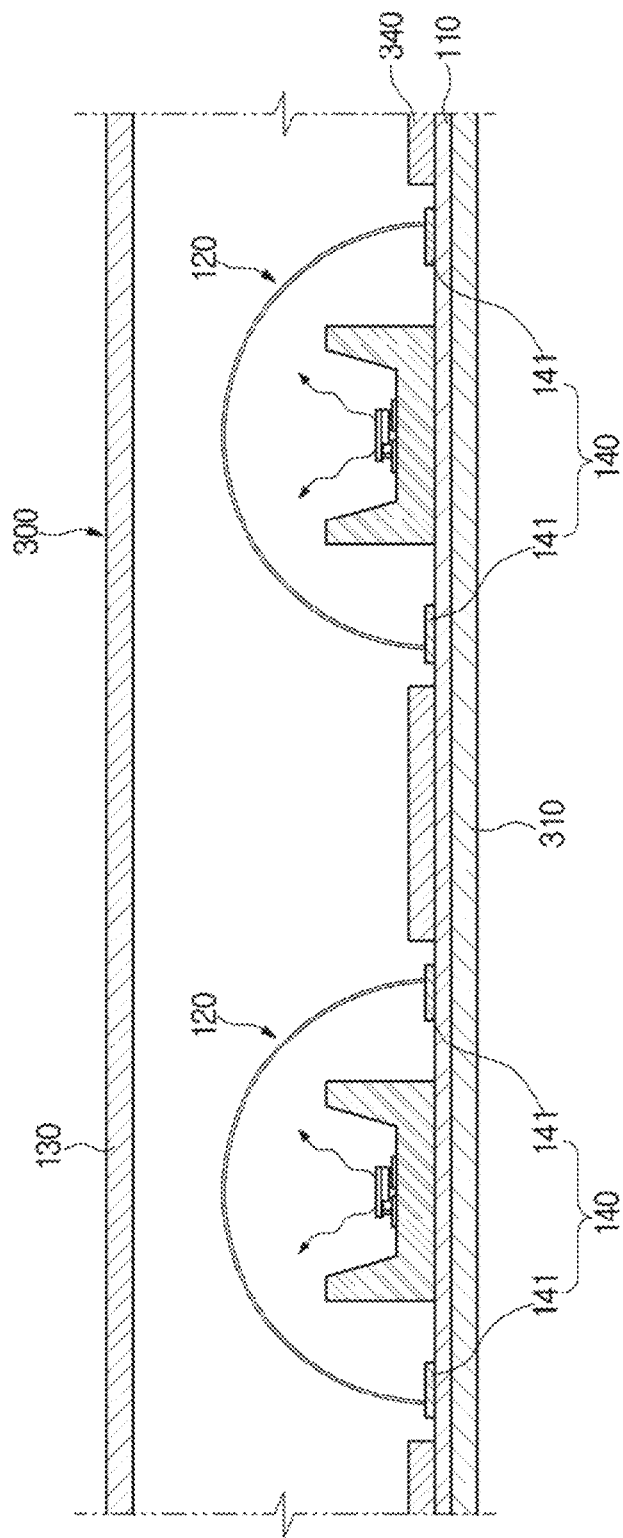
FIG. 29 is a cross-sectional view of a white light emitting device which further includes a reflector.

FIG. 28 is an exploded perspective view of a white light emitting device which further includes a reflector, and FIG. 29 is a cross-sectional view of a white light emitting device which further includes a reflector.

Referring to FIGS. 28 and 29, the white light emitting device 300 including the plurality of light source modules 320 may further include a reflector 340.

The reflector 340 may be stacked on the plurality of light source modules 320, and reflect light emitted from the light source 120 toward the light converter 130 to increase a use rate of the light source 120. At this time, the reflector 340 may be provided in a reflective sheet or a reflective film type.

The reflector 340 may be provided by a method of stacking on the light source module 320 on which the light sources 120 are mounted. To this end, the reflector 340 may include a plurality of openings formed to correspond to the plurality of light sources 120. The diameter of the openings formed in the reflector 340 may be greater than that of the light source 120.

As described above, because the reflector 340 is provided by a method of stacking on the light source module 320 on which the light source 120 is mounted, the reparability of the light source 120 may be improved.

As is apparent from the above description, the color uniformity of a white light emitting device can be improved by converting a monochromatic light, which is reflected and refracted inside of the white light emitting device, to white light.

In addition, a color mura can be effectively compensated by determining an arrangement of phosphor members according to a pattern of the color mura of the white light emitting device.

Although a few exemplary embodiments have been shown and described, it would be appreciated by those skilled in the art that changes may be made in these exemplary embodiments without departing from the scope as defined in the following claims and their equivalents.

What is claimed is:

1. A light emitting device comprising:
a board;
a reflective sheet disposed on the board;
a plurality of light sources disposed on the board, each light source of the plurality of light sources including a light emitting diode configured to emit blue light; and
a plurality of phosphor members provided on the reflective sheet to surround the light emitting diode of each light source of the plurality of light sources, each of the plurality of phosphor members configured to convert at least part of blue light being incident on the plurality of phosphor members to light of a color different from blue,
wherein the plurality of light sources comprise a first light source, a second light source adjacent to the first light source in a row direction, and a third light source adjacent to the second light source in a column direction;
wherein the plurality of phosphor members comprise a plurality of first phosphor members provided on the reflective sheet to surround the first light source, a plurality of second phosphor members provided on the reflective sheet to surround the second light source and a plurality of third phosphor members provided on the reflective sheet to surround the third light source, and
wherein a number of the plurality of first phosphor members is the same as a number of the plurality of second phosphor members, and the number of the plurality of first phosphor members is greater than a number of the plurality of third phosphor members.

2. The light emitting device according to claim 1, wherein the plurality of first phosphor members are arranged substantially equiangular around the first light source, the plurality of second phosphor members are arranged substantially equiangular around the second light source, and the plurality of third phosphor members are arranged substantially equiangular around the third light source.

3. The light emitting device according to claim 1, wherein the plurality of first phosphor members are arranged substantially equidistant from each other around the first light source, the plurality of second phosphor members are arranged substantially equidistant from each other around the second light source, and the plurality of third phosphor members are arranged substantially equidistant from each other around the third light source.

4. The light emitting device according to claim 1, wherein the plurality of first phosphor members are arranged substantially equidistant from the first light source, the plurality of second phosphor members are arranged substantially equidistant from the second light source, and the plurality of third phosphor members are arranged substantially equidistant from the third light source.

5. The light emitting device according to claim 1, wherein the plurality of light sources further comprise a fourth light source adjacent to the first light source in the column direction,
wherein the plurality of phosphor members further comprise a plurality of fourth phosphor members provided on the reflective sheet to surround the fourth light source, and
wherein a number of the plurality of fourth phosphor members is the same as the number of the plurality of first phosphor members.

6. The light emitting device according to claim 5, wherein the fourth light source is adjacent to the third light source in the row direction.

7. The light emitting device according to claim 5, wherein a size of each of the plurality of fourth phosphor members is greater than a size of each of the plurality of third phosphor members.

8. The light emitting device according to claim 1, wherein a size of each of the plurality of first phosphor members is greater than a size of each of the plurality of third phosphor members.

9. The light emitting device according to claim 1, wherein a size of each of the plurality of second phosphor members is greater than a size of each of the plurality of third phosphor members.

10. A display apparatus comprising:
a display panel; and
a light emitting device configured to emit light on the display panel,
wherein the light emitting device comprises:
a board;
a reflective sheet disposed on the board;
a plurality of light sources disposed on the board, each light source of the plurality of light sources including a light emitting diode configured to emit blue light; and
a plurality of phosphor members provided on the reflective sheet to surround the light emitting diode of each light source of the plurality of light sources, each of the plurality of phosphor members configured to convert at least part of blue light being incident on the plurality of phosphor members to light of a color different from blue,
wherein the plurality of light sources comprise a first light source, a second light source adjacent to the first light source in a row direction, and a third light source adjacent to the second light source in a column direction,
wherein the plurality of phosphor members comprise a plurality of first phosphor members provided on the reflective sheet to surround the first light source, a plurality of second phosphor members provided on the reflective sheet to surround the second light source and a plurality of third phosphor members provided on the reflective sheet to surround the third light source, and
wherein a number of the plurality of first phosphor members is the same as a number of the plurality of second phosphor members, and the number of the plurality of first phosphor members is greater than a number of the plurality of third phosphor members.

11. The display apparatus according to claim 10, wherein the plurality of first phosphor members are arranged substantially equiangular around the first light source, the plurality of second phosphor members are arranged substantially equiangular around the second light source, and the plurality of third phosphor members are arranged substantially equiangular around the third light source.

12. The display apparatus according to claim 10, wherein the plurality of first phosphor members are arranged substantially equidistant from each other around the first light source, the plurality of second phosphor members are arranged substantially equidistant from each other around the second light source, and the plurality of third phosphor members are arranged substantially equidistant from each other around the third light source.

13. The display apparatus according to claim 10, wherein the plurality of first phosphor members are arranged substantially equidistant from the first light source, the plurality of second phosphor members are arranged substantially equidistant from the second light source, and the plurality of third phosphor members are arranged substantially equidistant from the third light source.

14. The display apparatus according to claim 10, wherein the plurality of light sources further comprise a fourth light source adjacent to the first light source in the column direction,
- wherein the plurality of phosphor members further comprise a plurality of fourth phosphor members provided on the reflective sheet to surround the fourth light source, and
- wherein a number of the plurality of fourth phosphor members is the same as the number of the plurality of first phosphor members.

15. The display apparatus according to claim 14, wherein the fourth light source is adjacent to the third light source in the row direction.

16. The display apparatus according to claim 14, wherein a size of each of the plurality of fourth phosphor members is greater than a size of each of the plurality of third phosphor members.

17. The display apparatus according to claim 10, wherein a size of each of the plurality of first phosphor members is greater than a size of each of the plurality of third phosphor members.

18. The display apparatus according to claim 10, wherein a size of each of the plurality of second phosphor members is greater than a size of each of the plurality of third phosphor members.

* * * * *